(12) United States Patent
Wu et al.

(10) Patent No.: US 11,855,168 B2
(45) Date of Patent: Dec. 26, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Wei-Hao Wu, Hsinchu (TW); Zhi-Chang Lin, Zhubei (TW); Ting-Hung Hsu, MiaoLi (TW); Kuan-Lun Cheng, Hsin-chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 17/722,623

(22) Filed: Apr. 18, 2022

(65) Prior Publication Data
US 2022/0238683 A1    Jul. 28, 2022

Related U.S. Application Data

(60) Continuation of application No. 16/683,486, filed on Nov. 14, 2019, now Pat. No. 11,309,396, which is a
(Continued)

(51) Int. Cl.
*H01L 29/423*   (2006.01)
*H01L 29/66*    (2006.01)
(Continued)

(52) U.S. Cl.
CPC ........ *H01L 29/42392* (2013.01); *B82Y 10/00* (2013.01); *H01L 21/762* (2013.01);
(Continued)

(58) Field of Classification Search
CPC .......... H01L 29/0673; H01L 29/42392; H01L 29/66439; H01L 29/66545;
(Continued)

(56) References Cited

U.S. PATENT DOCUMENTS 9,209,247 B2   12/2015   Colinge et al.
9,236,267 B2    1/2016   De et al.
(Continued)

FOREIGN PATENT DOCUMENTS

WO    WO 2017/105515 A1    6/2017

OTHER PUBLICATIONS

U.S. Office Action for U.S. Appl. No. 16/373,988, dated May 14, 2020.
(Continued)

*Primary Examiner* — Walter H Swanson
(74) *Attorney, Agent, or Firm* — Birch, Stewart, Kolasch & Birch, LLP

(57) ABSTRACT

A semiconductor device includes a first device formed over a substrate. The first device includes a first device formed over a substrate, and the first device includes a first gate stack structure encircling a plurality of first nanostructures. The semiconductor device includes a first epitaxy structure wrapping an end of one of the first nanostructures, and a second device formed over the first device, wherein the second device includes a second gate stack structure encircling a plurality of second nanostructures. The semiconductor device includes a second epitaxy structure wrapping an end of one of the second nanostructures, and the second epitaxy structure is directly above the first epitaxy structure.

20 Claims, 23 Drawing Sheets

Related U.S. Application Data continuation of application No. 16/373,988, filed on Apr. 3, 2019, now Pat. No. 11,133,394, which is a division of application No. 15/716,699, filed on Sep. 27, 2017, now Pat. No. 10,269,914.

(51) Int. Cl.

| | | |
|---|---|---|
| *H01L 29/786* | (2006.01) | |
| *H01L 27/092* | (2006.01) | |
| *B82Y 10/00* | (2011.01) | |
| *H01L 21/762* | (2006.01) | |
| *H01L 21/8238* | (2006.01) | |
| *H01L 21/8234* | (2006.01) | |
| *H01L 29/06* | (2006.01) | |
| *H01L 29/775* | (2006.01) | |
| *H01L 21/822* | (2006.01) | |
| *H01L 27/06* | (2006.01) | |
| *H01L 27/12* | (2006.01) | |
| *H01L 29/08* | (2006.01) | |
| *H01L 27/088* | (2006.01) | |

(52) U.S. Cl.
CPC .... *H01L 21/76224* (2013.01); *H01L 21/8221* (2013.01); *H01L 21/823418* (2013.01); *H01L 21/823431* (2013.01); *H01L 21/823437* (2013.01); *H01L 21/823462* (2013.01); *H01L 21/823828* (2013.01); *H01L 27/0688* (2013.01); *H01L 27/088* (2013.01); *H01L 27/092* (2013.01); *H01L 27/1211* (2013.01); *H01L 27/1248* (2013.01); *H01L 29/0673* (2013.01); *H01L 29/0847* (2013.01); *H01L 29/66439* (2013.01); *H01L 29/66545* (2013.01); *H01L 29/66795* (2013.01); *H01L 29/775* (2013.01); *H01L 29/78654* (2013.01); *H01L 29/78684* (2013.01); *H01L 29/78696* (2013.01); *H01L 29/66469* (2013.01)

(58) Field of Classification Search
CPC ......... H01L 29/66795; H01L 29/66469; H01L 29/78654; H01L 29/78684; H01L 29/78696
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,660,028 B1 | 5/2017 | Cheng et al. |
| 9,831,324 B1 | 11/2017 | Chao et al. |
| 9,865,681 B1 | 1/2018 | Wu et al. |
| 10,074,575 B1 | 9/2018 | Guillorn et al. |
| 2015/0014789 A1 | 1/2015 | Xiong et al. |
| 2015/0380548 A1 | 12/2015 | Wang et al. |
| 2016/0240652 A1 | 8/2016 | Ching et al. |
| 2016/0254261 A1 | 9/2016 | Machkaoutsan et al. |
| 2016/0315171 A1 | 10/2016 | Hung et al. |
| 2017/0069763 A1* | 3/2017 | Doris ................ H01L 29/78684 |
| 2017/0194213 A1 | 7/2017 | Ching et al. |
| 2017/0256608 A1 | 9/2017 | Suk et al. |
| 2017/0309719 A1 | 10/2017 | Sun et al. |
| 2018/0096899 A1 | 4/2018 | Beasor et al. |
| 2018/0175194 A1 | 6/2018 | Reboh et al. |

OTHER PUBLICATIONS

U.S. Office Action for U.S. Appl. No. 16/373,988, dated Oct. 9, 2020.

U.S. Office Action, dated Mar. 25, 2021, for U.S. Appl. No. 16/373,988.

\* cited by examiner

SEMICONDUCTOR DEVICE AND MANUFACTURING METHOD THEREOF

PRIORITY CLAIM AND CROSS-REFERENCE

This is a Continuation application of U.S. patent application Ser. No. 16/683,486, filed on Nov. 14, 2019, which is a Continuation application of U.S. patent application Ser. No. 16/373,988, filed on Apr. 3, 2019, which is a divisional application of U.S. patent application Ser. No. 15/716,699 filed on Sep. 27, 2017, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
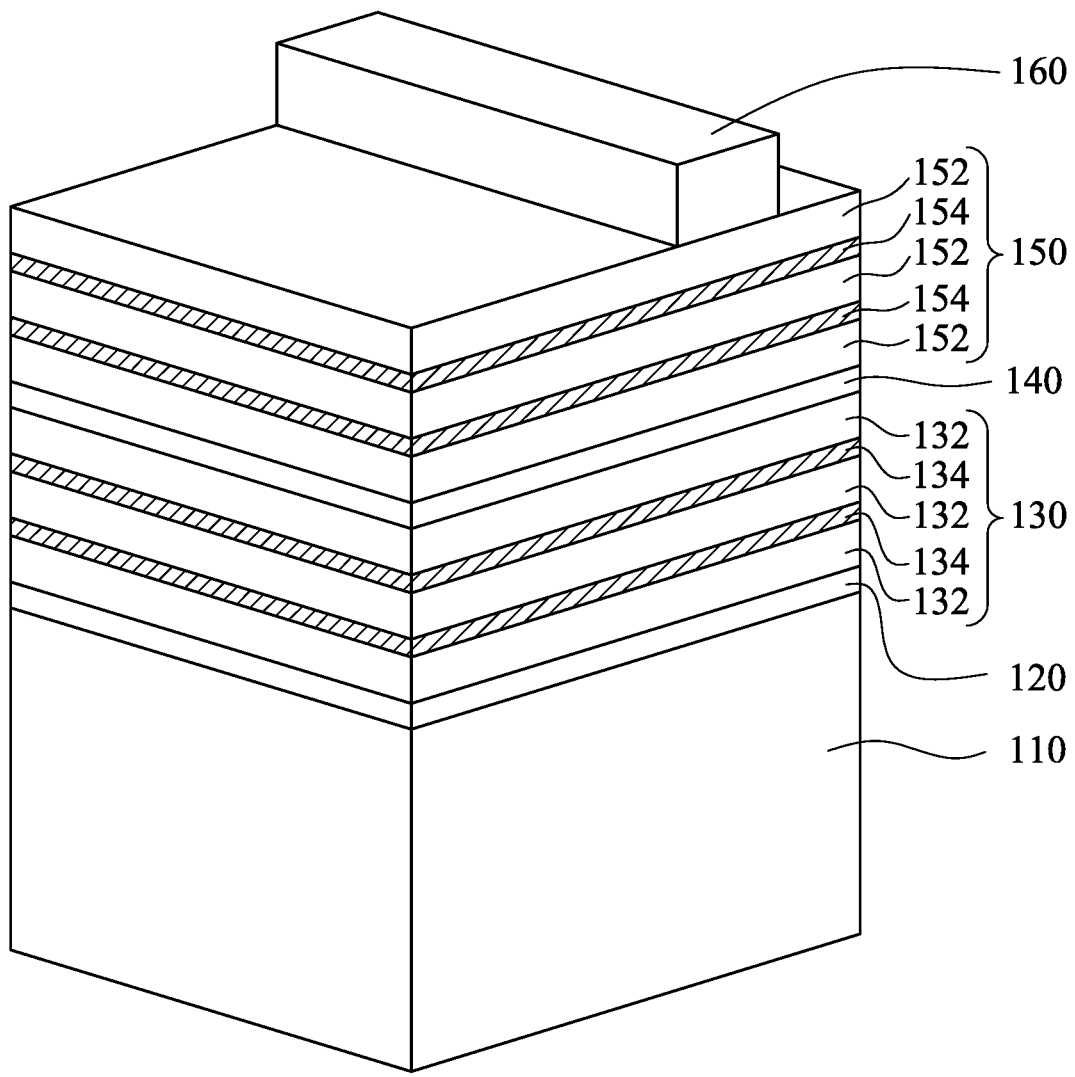
FIGS. 1-6, 7A, 8A, 9A, 10, 11A, 12A, 13A, and 14-17 are perspective views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, the present disclosure is related to gate-all-around (GAA) devices. A GAA device includes a device that has its gate structure, or portions thereof, formed on four-sides of a channel region (e.g., surrounding a portion of a channel region). The channel region of a GAA device may include nanowire channels, bar-shaped channels, and/or other suitable channel configurations. In some embodiments, the channel region of a GAA device may have multiple horizontal nanowires or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1-6, 7A, 8A, 9A, 10, 11A, 12A, 13A, and 14-17 are perspective views of a method for manufacturing a semiconductor device at various stages in accordance with some embodiments of the present disclosure. Reference is made to FIG. 1. In some embodiments, the semiconductor device as shown in FIGS. 1-6, 7A, 8A, 9A, 10, 11A, 12A, 13A, and 14-17 may be intermediate devices fabricated during processing of an IC, or a portion thereof, that may include static random access memory (SRAM) and/or logic circuits, passive components such as resistors, capacitors, and inductors, and active components such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

A substrate 110, which may be a part of a wafer, is provided. The substrate 110 may be a semiconductor substrate, which may further be a silicon substrate, a silicon carbon substrate, a silicon-on-insulator substrate or a substrate formed of other semiconductor materials.

A first sacrificial layer 120 is formed on the substrate 110. The first sacrificial layer 120 may be epitaxially grown on the substrate 110, such that the first sacrificial layer 120 forms a crystalline layer. The first sacrificial layer 120 and the substrate 110 have different materials and/or components, such that the first sacrificial layer 120 and the substrate 110 have different etching rates. In some embodiments, the first sacrificial layer 120 is made of silicon germanium (SiGe). The germanium percentage (atomic percentage) of the first sacrificial layer 120 is in the range between about 40 percent and about 60 percent, while higher or lower germanium percentages may be used. It is appreciated, however, that the values recited throughout the description are examples, and may be changed to different values. In some embodiments, the thickness of the first sacrificial layer 120 is in the range between about 20 nm to about 100 nm.

A first semiconductor stack 130 is formed over the first sacrificial layer 120 through epitaxy, such that the first semiconductor stack 130 forms crystalline layers. The first semiconductor stack 130 includes semiconductor layers 132 and 134 stacked alternatively. The semiconductor layers 132 can be SiGe layers having a germanium percentage lower than the germanium percentage in the first sacrificial layer 120. In some embodiments, the germanium percentage of the semiconductor layers 132 is in the range between about 20 percent and about 30 percent. Furthermore, a difference between the germanium percentages of the first sacrificial layer 120 and the germanium percentage of the semiconductor layers 132 may be greater than about 20 percent or higher. In some embodiments, the thickness of the semiconductor layers 132 is in the range between about 10 nm and about 20 nm.

The semiconductor layers 134 may be pure silicon layers that are free from germanium. The semiconductor layers 134 may also be substantially pure silicon layers, for example, with a germanium percentage lower than about 1 percent. Furthermore, the semiconductor layers 134 may be intrinsic, which are not doped with p-type and n-type impurities. There may be two, three, four, or more of the semiconductor layers 134. In some embodiments, the thickness of the semiconductor layers 134 is in the range between about 3 nm and about 10 nm. In some other embodiments, however, the semiconductor layers 134 can be silicon germanium or germanium for p-type semiconductor device, or can be III-V materials, such as InAs, InGaAs, InGaAsSb, GaAs, InPSb, or other suitable materials.

A second sacrificial layer 140 is formed on the first semiconductor stack 130. The second sacrificial layer 140 may be epitaxially grown on the first semiconductor stack 130, such that the second sacrificial layer 140 forms a crystalline layer. The second sacrificial layer 140 and the substrate 110 have different materials and/or components, such that the second sacrificial layer 140 and the substrate 110 have different etching rates. Furthermore, the second sacrificial layer 140 and the first sacrificial layer 120 have substantially the same material and/or component, such that the second sacrificial layer 140 and the first sacrificial layer 120 have substantially the same etching rate. In some embodiments, the second sacrificial layer 140 is made of silicon germanium (SiGe). The germanium percentage (atomic percentage) of the second sacrificial layer 140 is in the range between about 40 percent and about 60 percent, while higher or lower germanium percentages may be used. It is appreciated, however, that the values recited throughout the description are examples, and may be changed to different values. In some embodiments, the thickness of the second sacrificial layer 140 is in the range between about 20 nm to about 100 nm.

A second semiconductor stack 150 is formed over the second sacrificial layer 140 through epitaxy, such that the second semiconductor stack 150 forms crystalline layers. The second semiconductor stack 150 includes semiconductor layers 152 and 154 stacked alternatively. The semiconductor layers 152 can be SiGe layers having a germanium percentage lower than the germanium percentage in the second sacrificial layer 140. In some embodiments, the germanium percentage of the semiconductor layers 152 is in the range between about 20 percent and about 30 percent. Furthermore, a difference between the germanium percentage of the second sacrificial layer 140 and the germanium percentage of the semiconductor layers 152 may be greater than about 20 percent or higher. In some embodiments, the thickness of the semiconductor layers 152 is in the range between about 10 nm and about 20 nm.

The semiconductor layers 154 may be pure silicon layers that are free from germanium. The semiconductor layers 154 may also be substantially pure silicon layers, for example, with a germanium percentage lower than about 1 percent. Furthermore, the semiconductor layers 154 may be intrinsic, which are not doped with p-type and n-type impurities. There may be two, three, four, or more of the semiconductor layers 154. In some embodiments, the thickness of the semiconductor layers 154 is in the range between about 3 nm and about 10 nm. In some other embodiments, however, the semiconductor layers 154 can be silicon germanium or germanium for p-type semiconductor device, or can be III-V materials, such as InAs, InGaAs, InGaAsSb, GaAs, InPSb, or other suitable materials.

A patterned hard mask 160 is formed over the second semiconductor stack 150. In some embodiments, the patterned hard mask 160 is formed of silicon nitride, silicon oxynitride, silicon carbide, silicon carbo-nitride, or the like. The patterned hard mask 160 covers a portion of the second semiconductor stack 150 while leaves another portion of the second semiconductor stack 150 uncovered.

Figure 2:
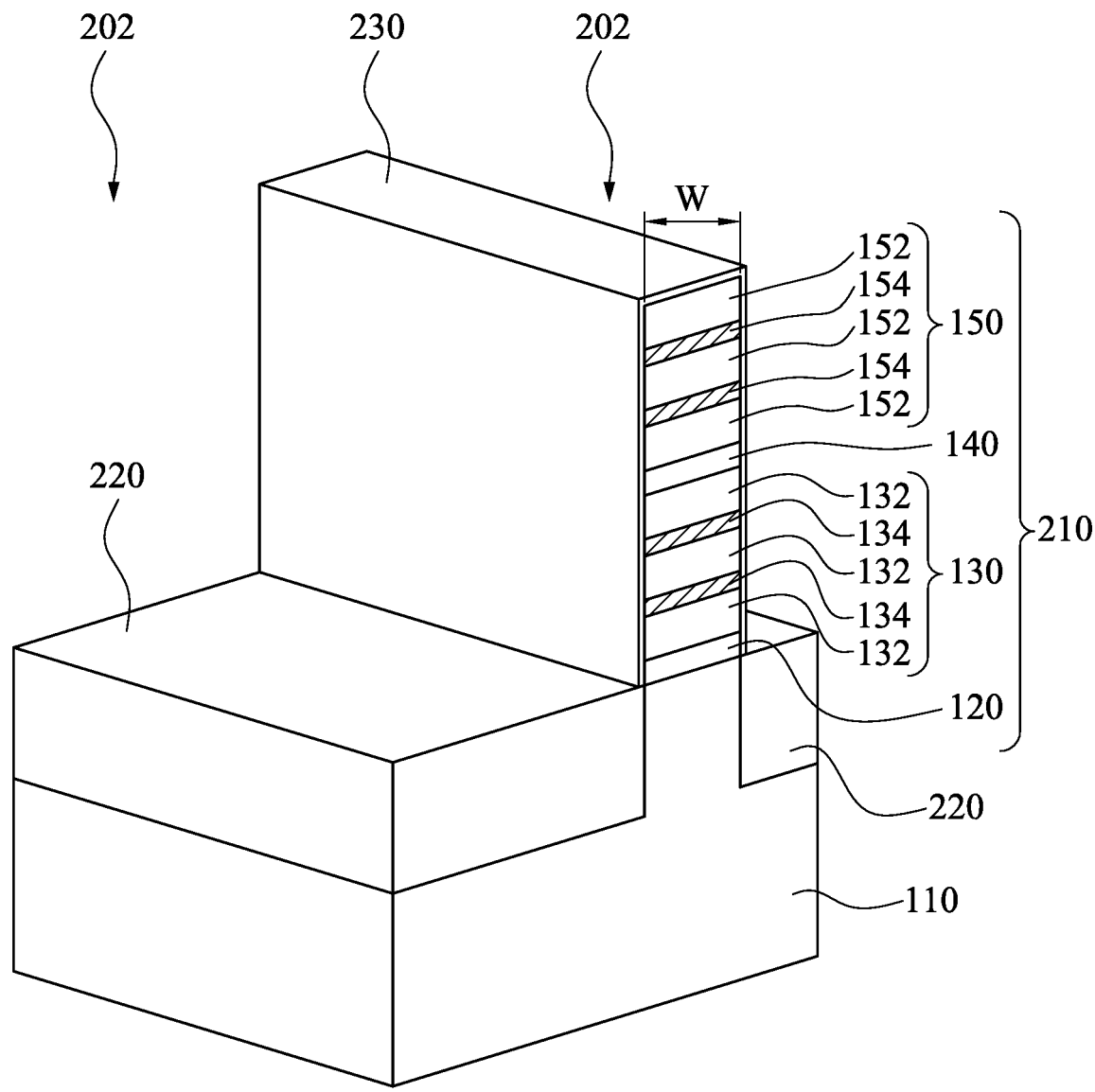

Reference is made to FIG. 2. The second semiconductor stack 150, the second sacrificial layer 140, the first semiconductor stack 130, the first sacrificial layer 120, and the substrate 110 are patterned using the patterned hard mask 160 as a mask to form trenches 202. Accordingly, at least one semiconductor strip 210 is formed. The trenches 202 extend into the substrate 110, and have lengthwise directions substantially parallel to each other. The remaining portions of the second semiconductor stack 150, the second sacrificial layer 140, the first semiconductor stack 130, and the first sacrificial layer 120 are accordingly referred to as the semiconductor strip 210 alternatively. In some embodiments, the width W of the semiconductor strip 210 is in a range of about 10 nm to about 100 nm.

Isolation structures 220, which may be Shallow Trench Isolation (STI) regions, are formed in the trenches 202. The formation may include filling the trenches 202 with a dielectric layer(s), for example, using Flowable Chemical Vapor Deposition (FCVD), and performing a Chemical Mechanical Polish (CMP) to level the top surface of the dielectric material with the top surface of the hard mask 160 (see FIG. 1). After the CMP, the hard mask layer 160 is removed.

The isolation structures 220 are recessed. The top surface of the resulting isolation structures 220 may be level with the bottom surface of the first sacrificial layer 120, or may be at an intermediate level between the top surface and the bottom surface of the first sacrificial layer 120. In some embodiments, the thickness of the isolation structures 220 in the range between about 50 nm and about 150 nm.

A dummy dielectric layer 230 is conformally formed to cover the semiconductor strip 210. In some embodiments, the dummy dielectric layer 230 may include silicon dioxide, silicon nitride, a high-κ dielectric material or other suitable material. In various examples, the dummy dielectric layer 230 may be deposited by an ALD process, a CVD process, a subatmospheric CVD (SACVD) process, a flowable CVD process, a PVD process, or other suitable process. By way of example, the dummy dielectric layer 230 may be used to prevent damage to the semiconductor strip 210 by subsequent processing (e.g., subsequent formation of the dummy gate structure).

Figure 3:
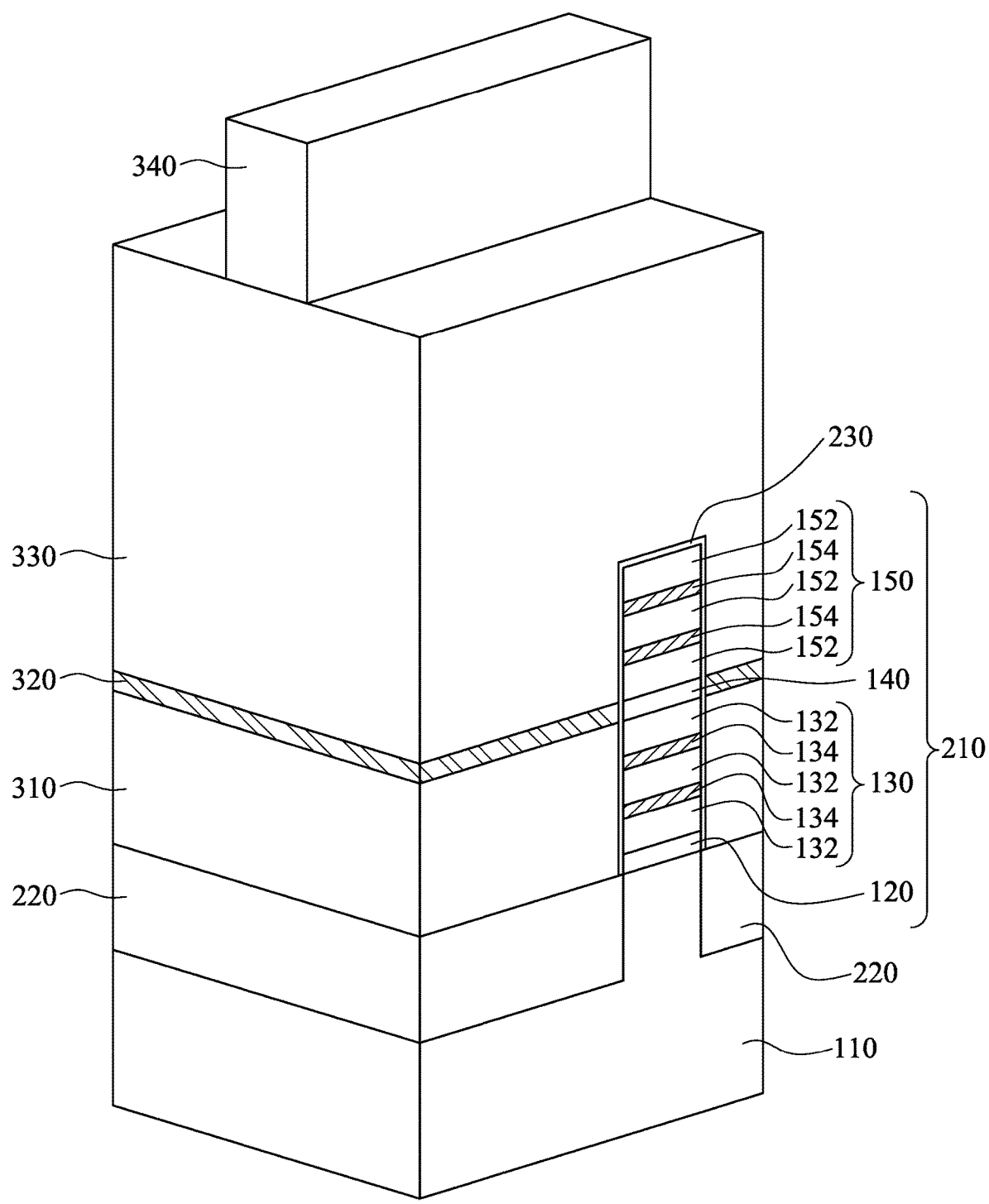

Reference is made to FIG. 3. A first dummy gate layer 310 is formed on the isolation structures 220 and at least on opposite sides of the semiconductor strip 210. In some embodiments, the first dummy gate layer 310 may include polycrystalline silicon (polysilicon). In some embodiments, the first dummy gate layer 310 may be formed by various process operations such as layer deposition, planarization, etching, as well as other suitable processing operations. Exemplary layer deposition processes includes CVD (including both low-pressure CVD and plasma-enhanced CVD), PVD, ALD, thermal oxidation, e-beam evaporation, or other suitable deposition techniques, or combinations thereof. A planarization process, such as a chemical mechanical planarization (CMP) process, may be then performed to expose the top surface of the dummy dielectric layer 230. The CMP process may remove portions of the first dummy gate layer 310 overlying the semiconductor strip 210 and may planarize a top surface of the structure. Then, an etching back process is performed to reduce the thickness of the first dummy gate layer 310 until the top surface of the first dummy gate layer 310 is substantially leveled with the top surface, the bottom surface, or intermediate level of the second sacrificial layer 140. In some embodiments, the etching process may include dry etching (e.g., RIE etching), wet etching, and/or other etching methods.

An etch stop layer 320 is formed on the first dummy gate layer 310. In some embodiments, oxygen ions are implanted into portions of the first dummy gate layer 310 beneath the top surface of the first dummy gate layer 310, and a thermal operation, such as a thermal operation to anneal the first dummy gate layer 310, results in a reaction between the implanted oxygen and the surrounding the first dummy gate layer 310 to provide the etch stop layer 320 on the first dummy gate layer 310. That is, the etch stop layer 320 can be made of silicon dioxide. In some embodiments, the anneal process may be a rapid thermal annealing (RTA) process, laser spike annealing (LSA) process, or other suitable annealing processes. In some other embodiments, the etch stop layer 320 can be made of dielectric materials such as oxide, SiN, SiOCN, and can be formed by a deposition and then etching back process.

A second dummy gate layer 330 is formed on the etch stop layer 320 and covers the semiconductor strip 210. In some embodiments, the second dummy gate layer 330 may include polycrystalline silicon (polysilicon). In some embodiments, the second dummy gate layer 330 may be formed by various process operations such as layer deposition, planarization, as well as other suitable processing operations. Exemplary layer deposition processes includes CVD (including both low-pressure CVD and plasma-enhanced CVD), PVD, ALD, thermal oxidation, e-beam evaporation, or other suitable deposition techniques, or combinations thereof. A planarization process, such as a CMP process, may be then performed. The CMP process may remove portions of the first dummy gate layer 310 and may planarize a top surface of the structure.

A patterned hard mask 340 is formed over the second dummy gate layer 330. In some embodiments, the patterned hard mask 340 is formed of silicon nitride, silicon oxynitride, silicon carbide, silicon carbo-nitride, or the like. The patterned hard mask 340 covers a portion of the second dummy gate layer 330 while leaves another portion of the second dummy gate layer 330 uncovered.

Figure 4:
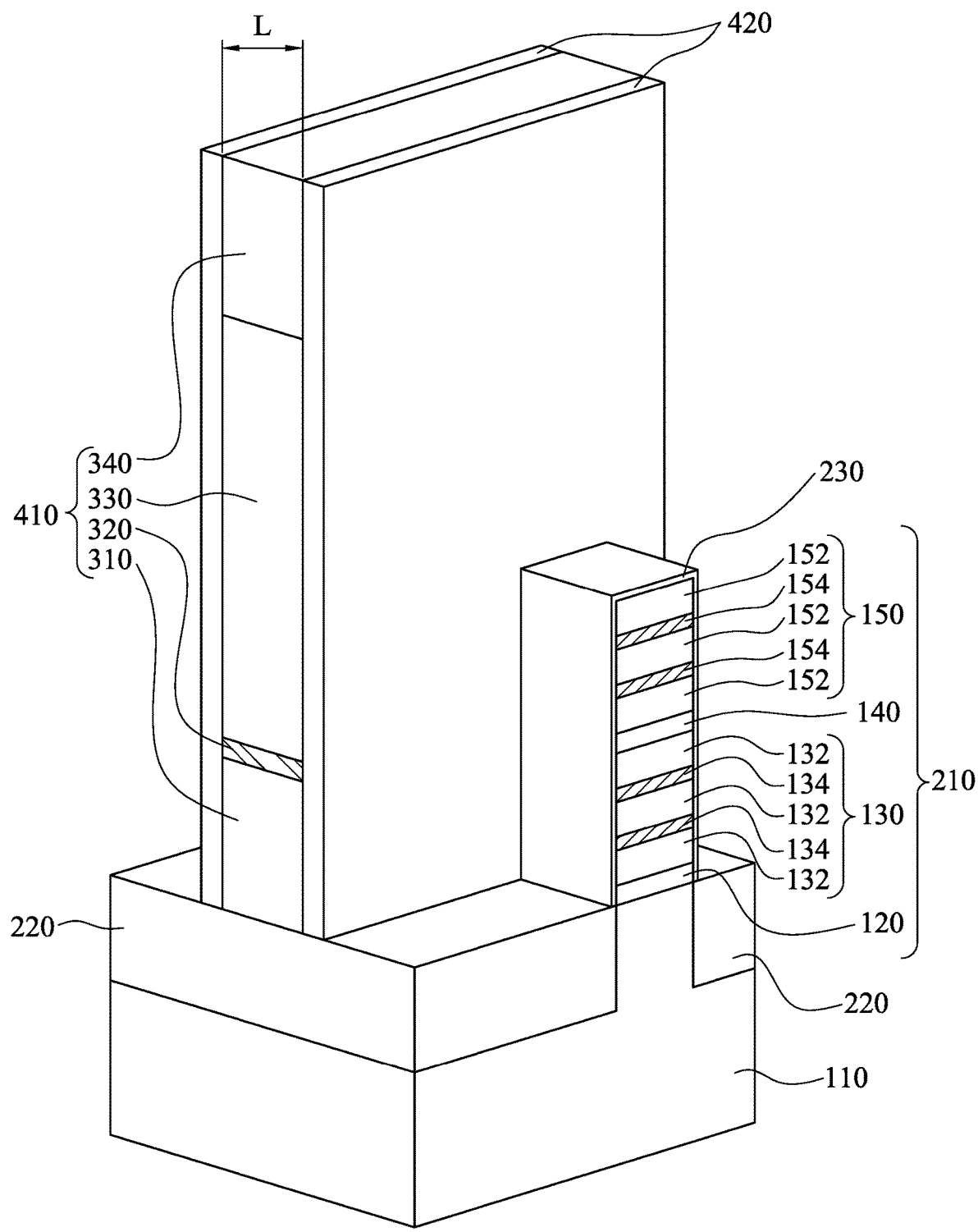

Reference is made to FIG. 4. The second dummy gate layer 330, the etch stop layer 320, and first dummy gate layer 310 are patterned using the patterned hard mask 340 as a mask to form at least one dummy gate stack 410 crossing the semiconductor strip 210. In some embodiments, the length L of the dummy gate stack 410 is in a range of about 5 nm to about 500 nm. The dummy gate stack 410 covers a portion of the semiconductor strip 210 and leaves other portions of the semiconductor strip 210 uncovered. In FIG. 4, the portion of the semiconductor strip 210 covered by the dummy gate stack 410 can be referred to as a channel region of the semiconductor strip 210, and the portions of the semiconductor strip 210 uncovered by the dummy gate stack 410 can be referred to as source/drain regions of the semiconductor strip 210.

Gate spacers 420 are respectively formed on sidewalls of the dummy gate stack 410. The gate spacers 420 may include a seal spacer and a main spacer (not shown). The gate spacers 420 include one or more dielectric materials, such as silicon oxide, silicon nitride, silicon oxynitride, SiCN, SiCxOyNz, or combinations thereof. The seal spacers are formed on sidewalls of the dummy gate stack 410 and the main spacers are formed on the seal spacers. The gate spacers 420 can be formed using a deposition method, such as plasma enhanced chemical vapor deposition (PECVD), low-pressure chemical vapor deposition (LPCVD), subatmospheric chemical vapor deposition (SACVD), or the like. The formation of the gate spacers 420 may include blanket forming spacer layers, and then performing etching operations to remove the horizontal portions of the spacer layers. The remaining vertical portions of the gate spacer layers form the gate spacers 420.

Figure 5:
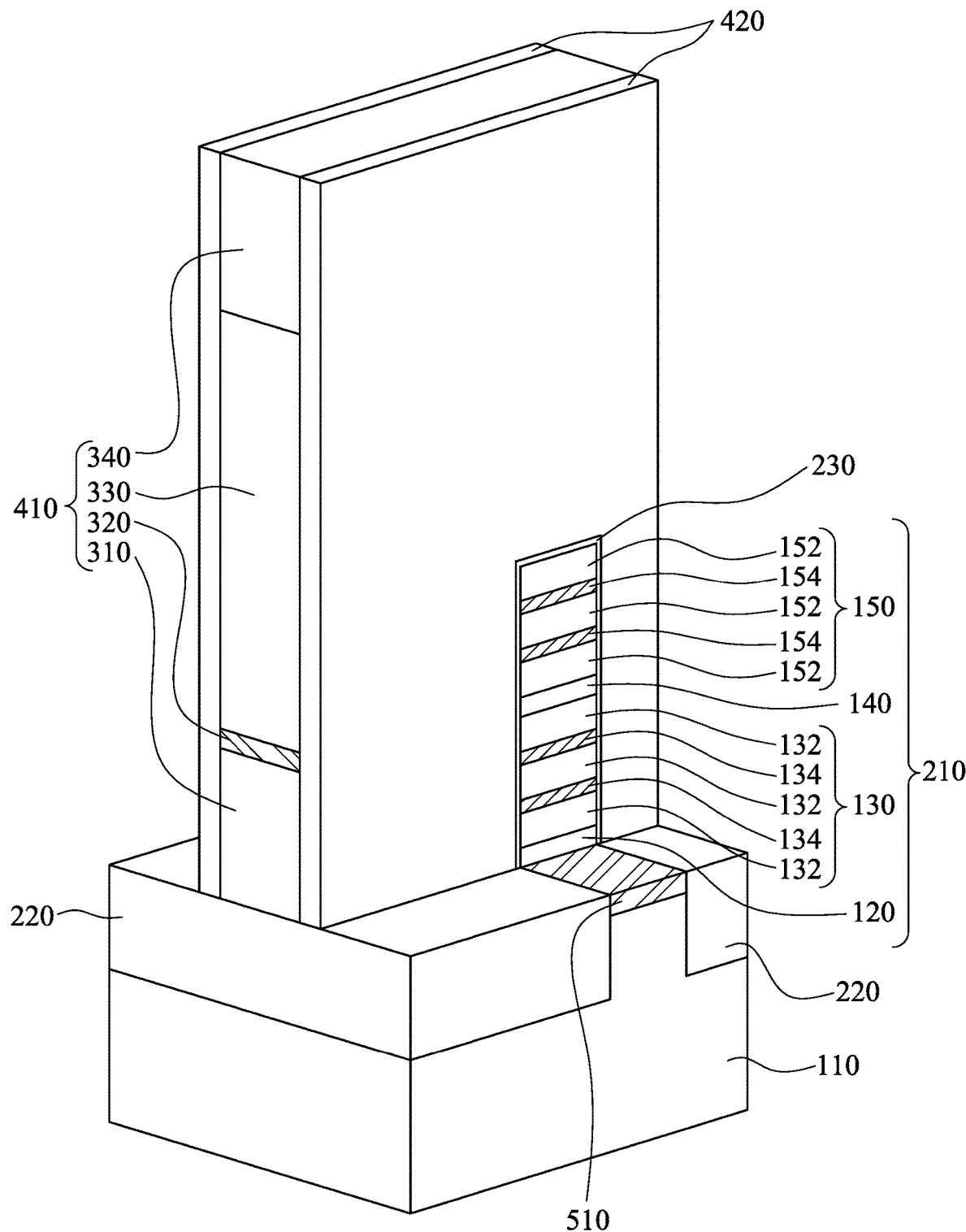

Reference is made to FIG. 5. Portions of the semiconductor strip 210 and the dummy dielectric layer 230 uncovered by the dummy gate stack 410 and the gate spacers 420 are removed, for example, by etching the semiconductor strip 210 and the dummy dielectric layer 230. The dummy gate stack 410 and the gate spacers 420 act as an etching mask. The etching process includes a dry etching process, a wet etching process, or combinations thereof. As such, the channel portion of the semiconductor strip 210 and a top surface of the substrate 110 are exposed.

An insulation layer 510 is formed on the top surface of the substrate 110. In some embodiments, oxygen ions are implanted into portions of the substrate 110 beneath the top surface of the substrate 110, and a thermal operation, such as a thermal operation to anneal the substrate 110, results in a reaction between the implanted oxygen and the surrounding substrate 110 to provide the insulation layer 510 on the substrate 110. That is, the insulating layer 510 can be made of silicon dioxide. In some embodiments, the anneal process may be a rapid thermal annealing (RTA) process, laser spike annealing (LSA) process, or other suitable annealing processes. In some other embodiments, the insulating layer 510 can be made of dielectric materials, and can be formed by a deposition and then etching back process. In some embodiments, the thickness of the insulating layer 510 is in a range of about 20 nm to about 100 nm.

Figure 6:
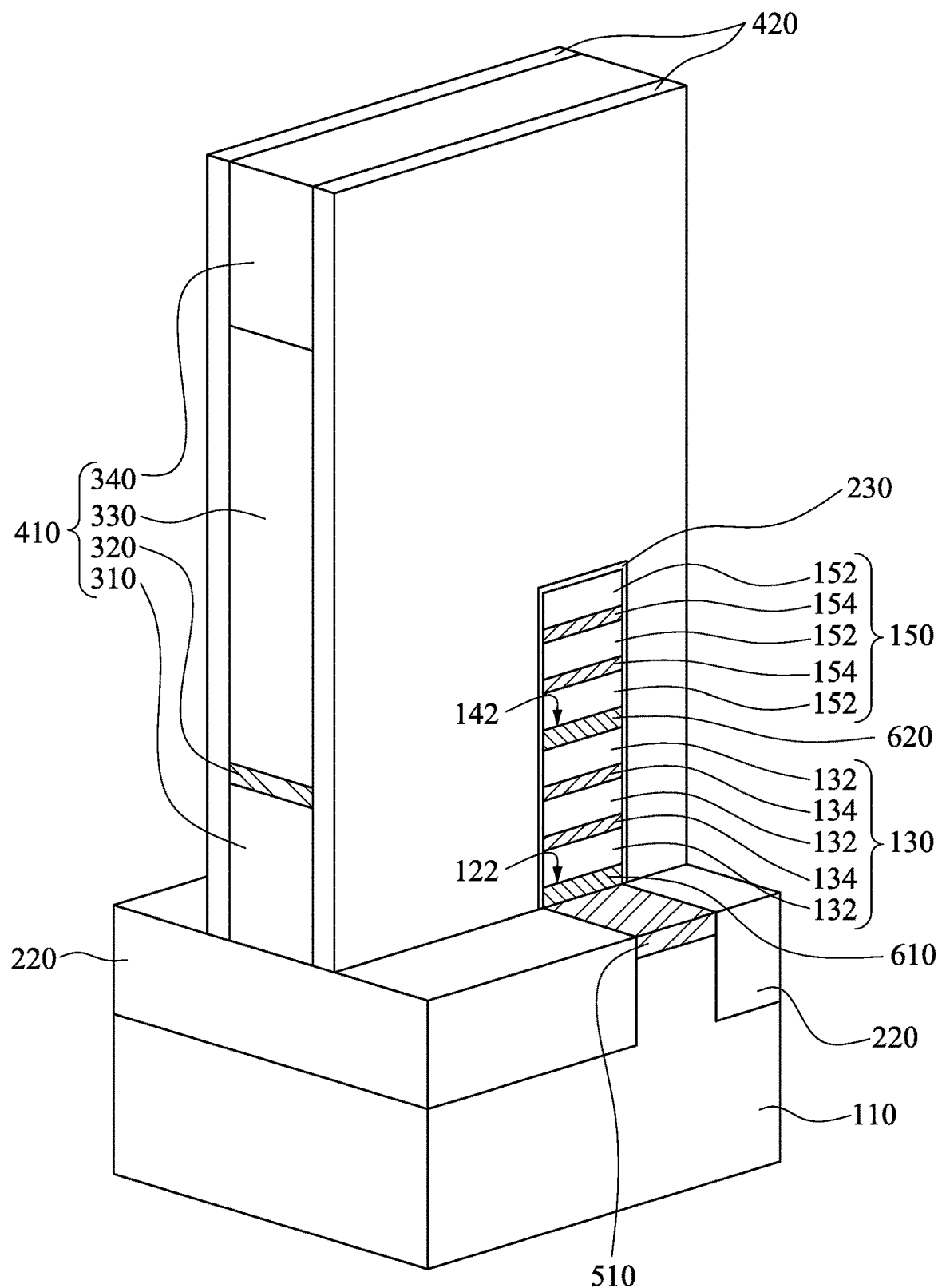

Reference is made to FIG. 6. The first sacrificial layer 120 and the second sacrificial layer 140 (see FIG. 5) are removed, for example, by performing an etching process. In some embodiments, the etching process can be a wet etch process which has high etching selectivity between germanium and silicon. Since the materials of the first sacrificial layer 120 and the second sacrificial layer 140 are different from the first semiconductor stack 130 and the second semiconductor stack 150, etching rates thereof are different, and the first semiconductor stack 130 and the second semiconductor stack 150 remain in place while the first sacrificial layer 120 and the second sacrificial layer 140 are removed. The first sacrificial layer 120 is removed and an opening 122 is formed between the first semiconductor stack 130 and the substrate 110, and the second sacrificial layer 140 is removed and an opening 142 is formed between the second semiconductor stack 150 and the first semiconductor stack 130.

A first inner gate spacer 610 is formed in the opening 122 and between the first semiconductor stack 130 and the substrate 110, and a second inner gate spacer 620 is formed in the opening 142 and between the second semiconductor stack 150 and the first semiconductor stack 130. The first inner gate spacer 610 and the second inner gate spacer 620 may be made of silicon nitride, oxide, metal oxide, or other dielectric such as SiCxOyNz. In some embodiments, the first inner gate spacer 610 and the second inner gate spacer 620 may be formed by performing an ALD process or other suitable process. In some embodiments, a trimming process can be performed after the first inner gate spacer 610 and the second inner gate spacer 620 are deposited in order to remove portions of the first inner gate spacer 610 and the second inner gate spacer 620 outside the openings 122 and 142.

Figure 7A:
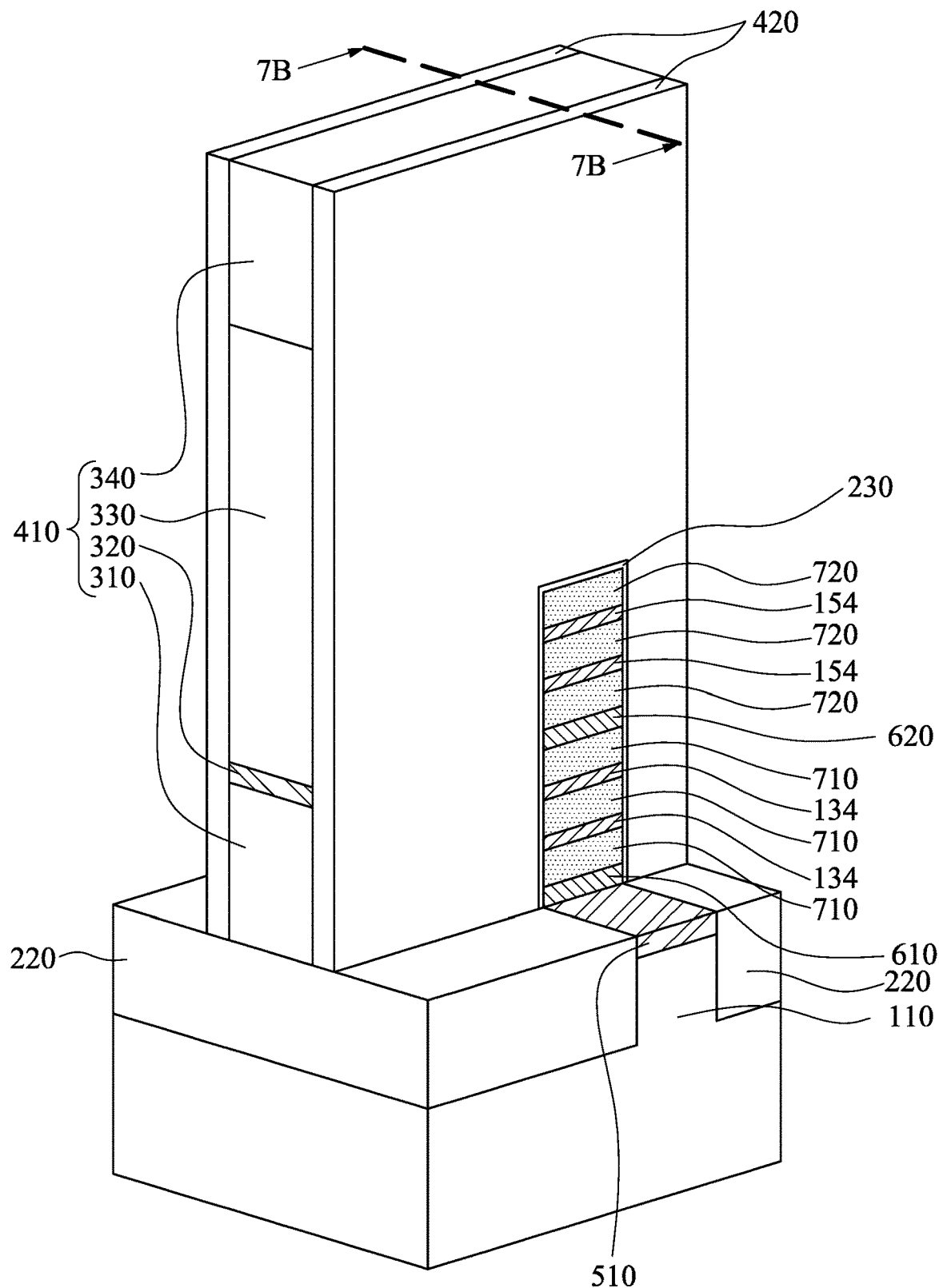
Figure 7B:
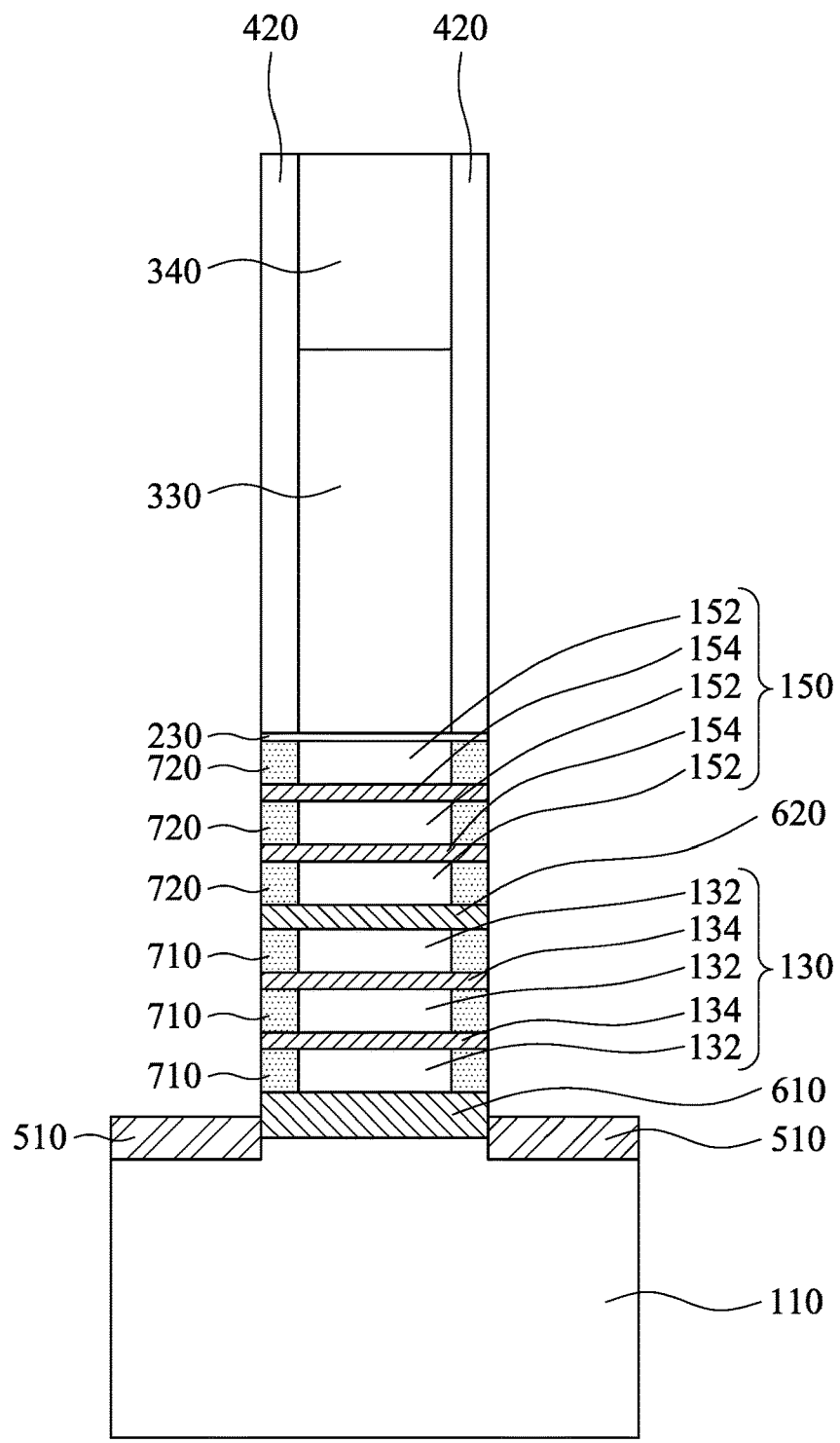
FIG. 7B is a cross-sectional view taking along line 7B-7B of FIG. 7A.

Reference is made to FIGS. 7A and 7B, where FIG. 7B is a cross-sectional view taking along line 7B-7B of FIG. 7A. The semiconductor layers 132 and 152 are trimmed. That is, exposed portions of the semiconductor layers 132 and 152 are removed, for example, by performing an etching process. In some embodiments, the etching process can be a wet etch process which has high etching selectivity between germanium and silicon. Since the materials of the semiconductor layers 132 and 152 are different from the semiconductor layers 134 and 154, etching rates thereof are different, and the semiconductor layers 134 and 154 remain in place while the semiconductor layers 132 and 152 are trimmed.

First sidewall spacers 710 are respectively formed on opposite sides of the semiconductor layers 132, and second sidewall spacers 720 are respectively formed on opposite sides of the semiconductor layers 152. The first sidewall spacers 710 and the second sidewall spacers 720 may be made of silicon nitride, oxide, metal oxide, or other dielectric such as SiCxOyNz. In some embodiments, the first sidewall spacers 710 and the second sidewall spacers 720 are formed by performing an ALD process or other suitable process. In some embodiments, a trimming process can be performed after the first sidewall spacers 710 and the second sidewall spacers 720 are deposited in order to remove portions of the first sidewall spacers 710 and the second sidewall spacers 720 external to the gate spacers 420.

Figure 8A:
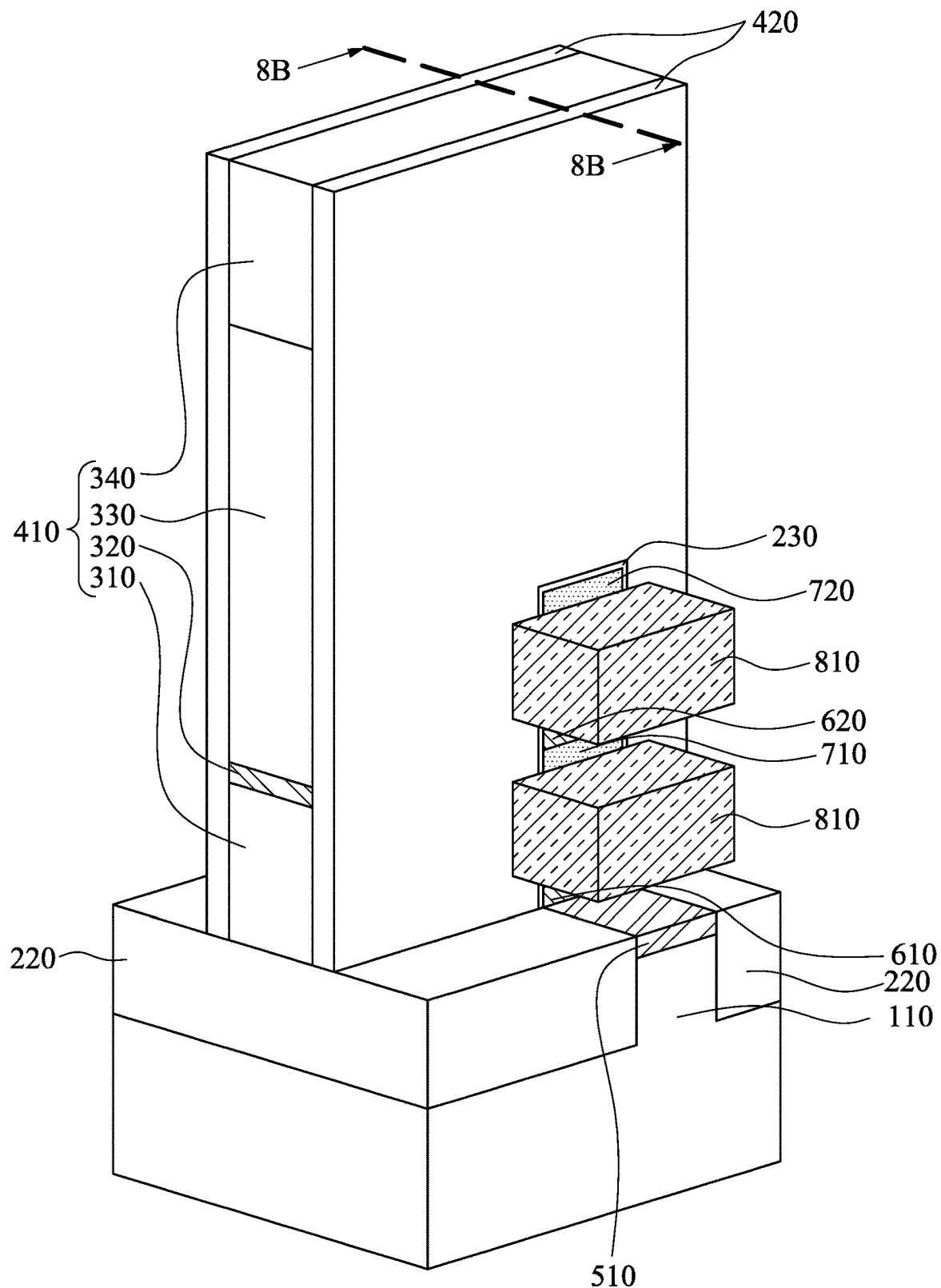
Figure 8B:
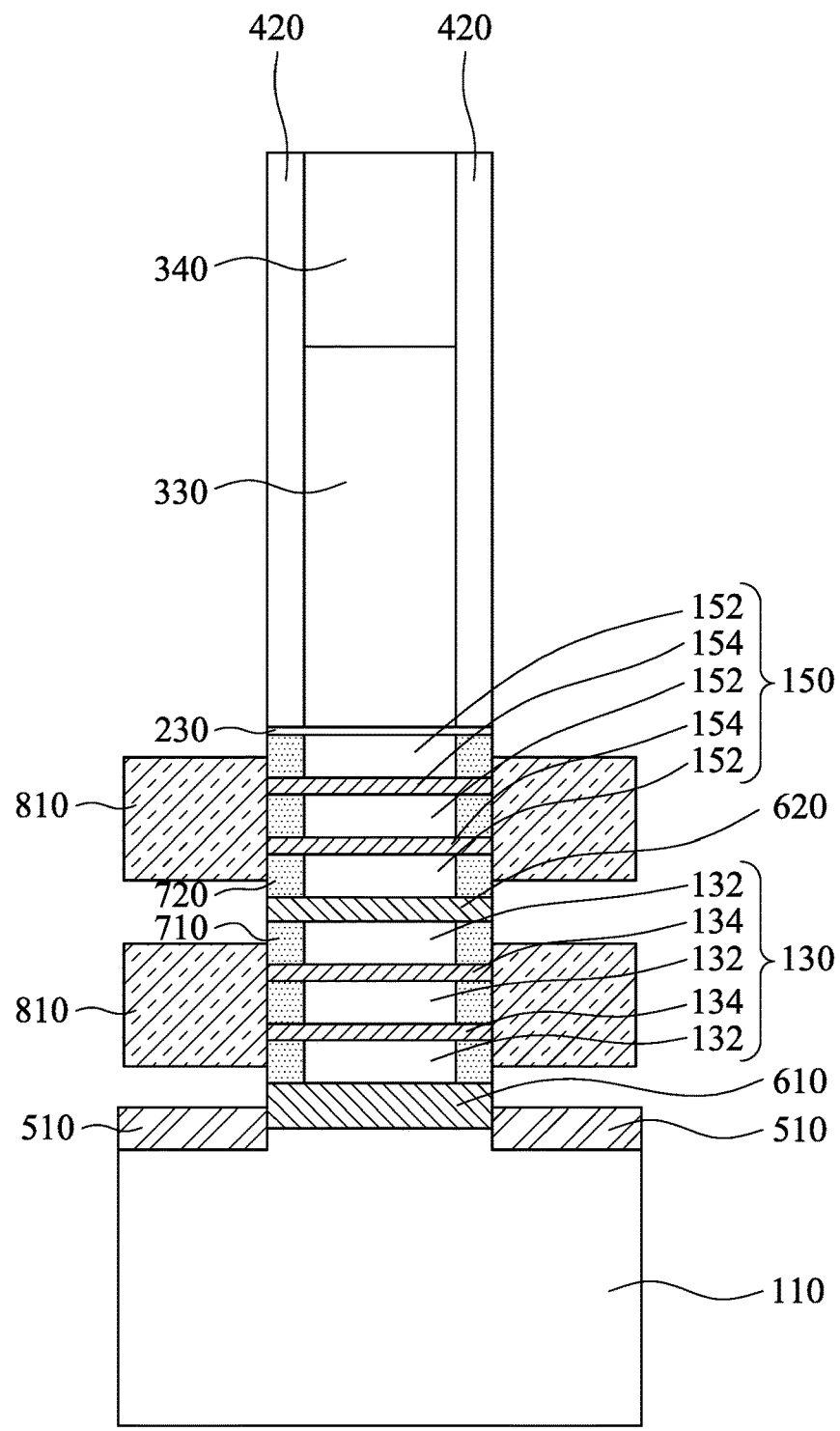
FIG. 8B is a cross-sectional view taking along line 8B-8B of FIG. 8A.

Reference is made to FIGS. 8A and 8B, where FIG. 8B is a cross-sectional view taking along line 8B-8B of FIG. 8A. First epitaxy structures 810 are formed on opposite sidewalls of the semiconductor layers 134 and 154 by performing, for example, a selectively growing process. That is, some of the first epitaxy structures 810 are in contact with the semiconductor layers 134, and other first epitaxy structures 810 are in contact with the semiconductor layers 154. The first epitaxy structures 810 are formed by epitaxially growing a semiconductor material. The semiconductor material includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The first epitaxy structures 810 have suitable crystallographic orientations (e.g., a (100), (110), or (111) crystallographic orientation). In some embodiments, the first epitaxy structures 810 include source/drain epitaxial structures. In some embodiments, where a PFET device is desired, the first epitaxy structures 810 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, the germanium concentration can be tuned if the first epitaxy structures 810 are made of silicon germanium. In some embodiments, the first epitaxy structures 810 can be doped, for example, boron-doped, and the dopant concentration can be tuned. In some embodiments, the sizes and/or the shapes of the first epitaxy structures 810 can be tuned. For example, the first epitaxy structures 810 can be cube-shaped as shown in FIG. 8A, or be diamond shaped in some other embodiments.

Figure 9A:
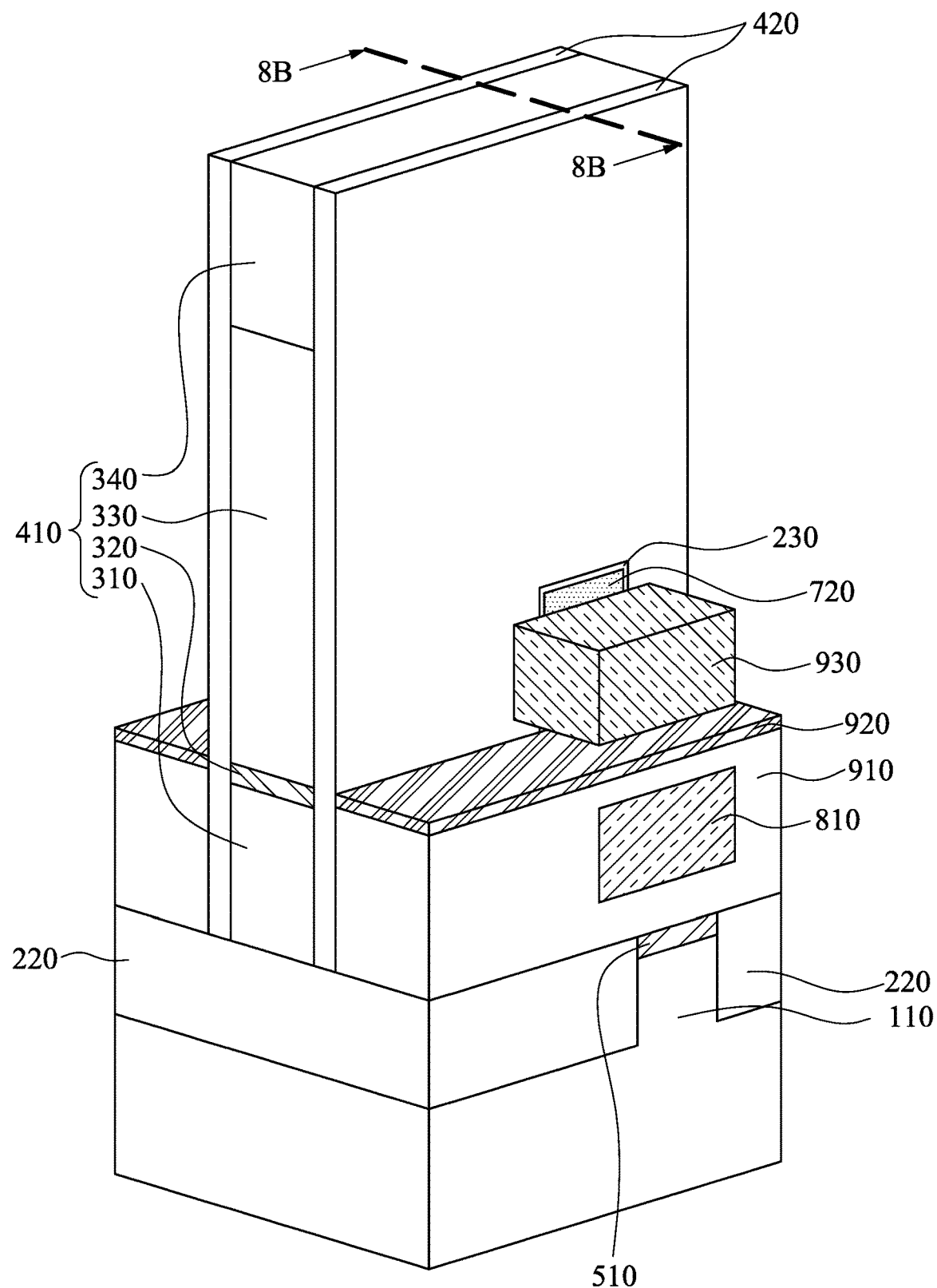
Figure 9B:
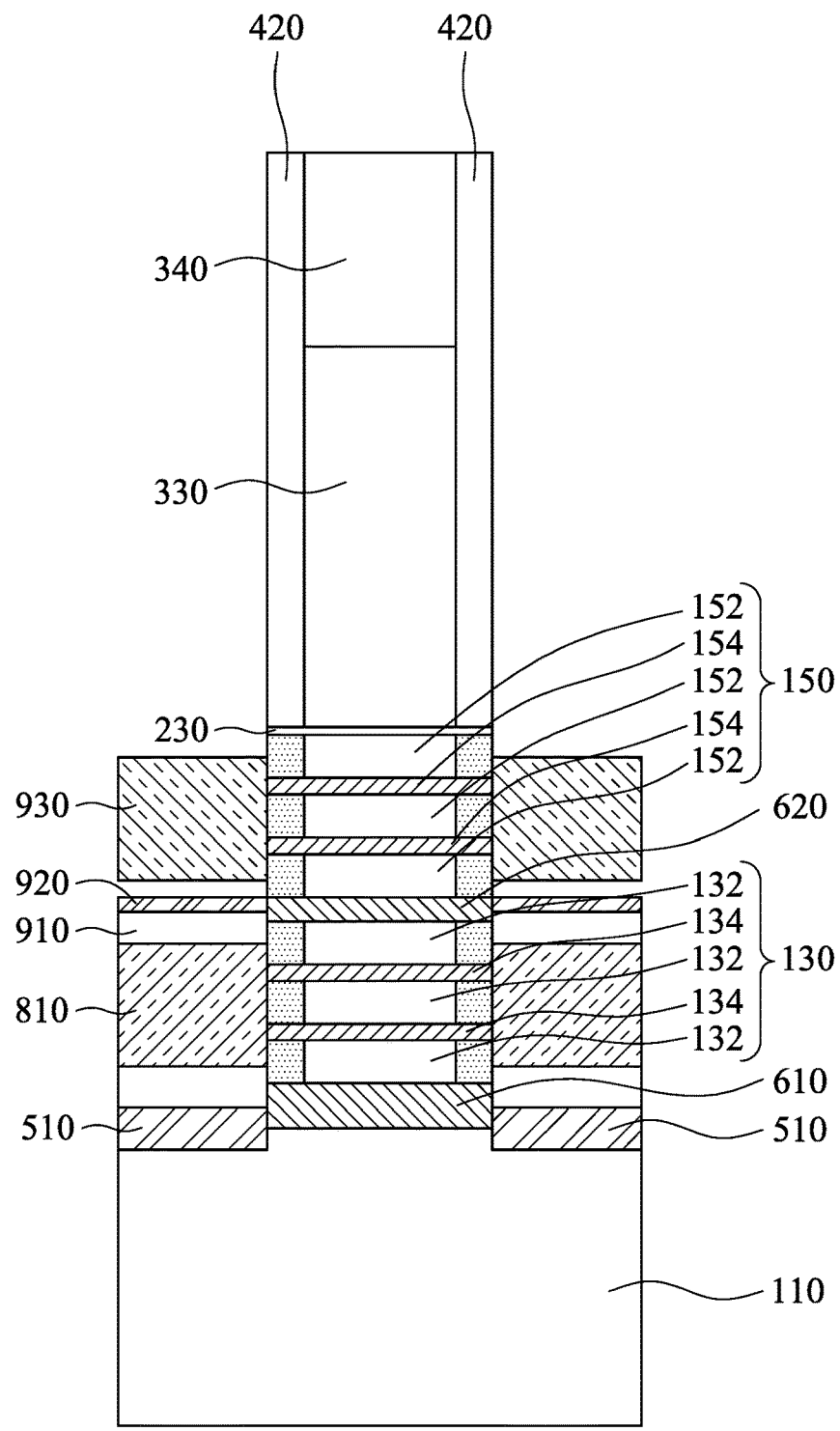
FIG. 9B is a cross-sectional view taking along line 9B-9B of FIG. 9A.

Reference is made to FIGS. 9A and 9B, where FIG. 9B is a cross-sectional view taking along line 9B-9B of FIG. 9A. A bottom interlayer dielectric (ILD) 910 is formed on the isolation structures 220, the insulation layer 510, and at least on opposite sides of the dummy gate stack 410. The bottom ILD 910 surrounds the first epitaxy structures 810 in contact with the semiconductor layers 134 and exposes the first epitaxy structures 810 in contact with the semiconductor layers 154 (see FIG. 8A). In some embodiments, the bottom ILD 910 may include amorphous silicon (a-Si) or amorphous germanium (a-Ge). In some embodiments, the bottom ILD 910 may be formed by various process operations such as layer deposition, planarization, etching, as well as other suitable processing operations. Exemplary layer deposition processes includes CVD (including both low-pressure CVD and plasma-enhanced CVD), PVD, ALD, thermal oxidation, e-beam evaporation, or other suitable deposition techniques, or combinations thereof. A planarization process, such as a CMP process, may be then performed to expose the top surface of the patterned hard mask 340. The CMP process may remove portions of the bottom ILD 910 overlying the patterned hard mask 340 and may planarize a top surface of the structure. Then, an etch back process is performed to reduce the thickness of the bottom ILD 910 until the top surface of the bottom ILD 910 is substantially leveled with the top surface, the bottom surface, or intermediate level of the etch stop layer 320 and/or the second inner gate spacer 620. In some embodiments, the etching process may include dry etching (e.g., RIE etching), wet etching, and/or other etching methods.

It is noted that during the bottom ILD 910 is etched back, the first epitaxy structures 810 in contact with the semiconductor layers 154 (see FIG. 8A) is also be removed. As such, the semiconductor layers 154 and the second sidewall spacers 720 are exposed.

An etch stop layer 920 is formed on the bottom ILD 910. In some embodiments, oxygen ions are implanted into portions of the bottom ILD 910 beneath the top surface of the bottom ILD 910, and a thermal operation, such as a thermal operation to anneal the bottom ILD 910, results in a reaction between the implanted oxygen and the surrounding the bottom ILD 910 to provide the etch stop layer 920 on the bottom ILD 910. That is, the etch stop layer 920 can be made of silicon dioxide. In some embodiments, the anneal process may be a rapid thermal annealing (RTA) process, laser spike annealing (LSA) process, or other suitable annealing processes. In some other embodiments, the etch stop layer 920 can be made of dielectric materials such as oxide, SiN, SiOCN, and can be formed by a deposition and then etching back process.

Second epitaxy structures 930 are formed on opposite sidewalls of the semiconductor layers 154 by performing, for example, a selectively growing process. That is, the second epitaxy structures 930 are in contact with the semiconductor layers 154 and separated from the first epitaxy structures 810. The second epitaxy structures 930 are formed by epitaxially growing a semiconductor material. The semiconductor material includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The second epitaxy structures 930 have suitable crystallographic orientations (e.g., a (100), (110), or (111) crystallographic orientation). In some embodiments, the second epitaxy structures 930 include source/drain epitaxial structures. In some embodiments, where an NFET device is desired, the second epitaxy structures 930 may include an epitaxially growing silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, the second epitaxy structures 930 can be doped, for example, P-doped or As-doped, and the dopant concentration can be tuned. In some embodiments, the sizes and/or the shapes of the second epitaxy structures 930 can be tuned. For example, the second epitaxy structures 930 can be cube-shaped as shown in FIG. 9A, or be diamond shaped in some other embodiments.

It is noted that in FIG. 9A, the first epitaxy structures 810 are p-type epitaxy structures, and the second epitaxy structures 930 are n-type epitaxy structures. In some other embodiments, however, the first epitaxy structures 810 can be n-type epitaxy structures, and the second epitaxy structures 930 can be p-type epitaxy structures. Embodiments fall within the present disclosure if the first epitaxy structures 810 and the second epitaxy structures 930 are different types or same type of epitaxy structures.

Figure 10:
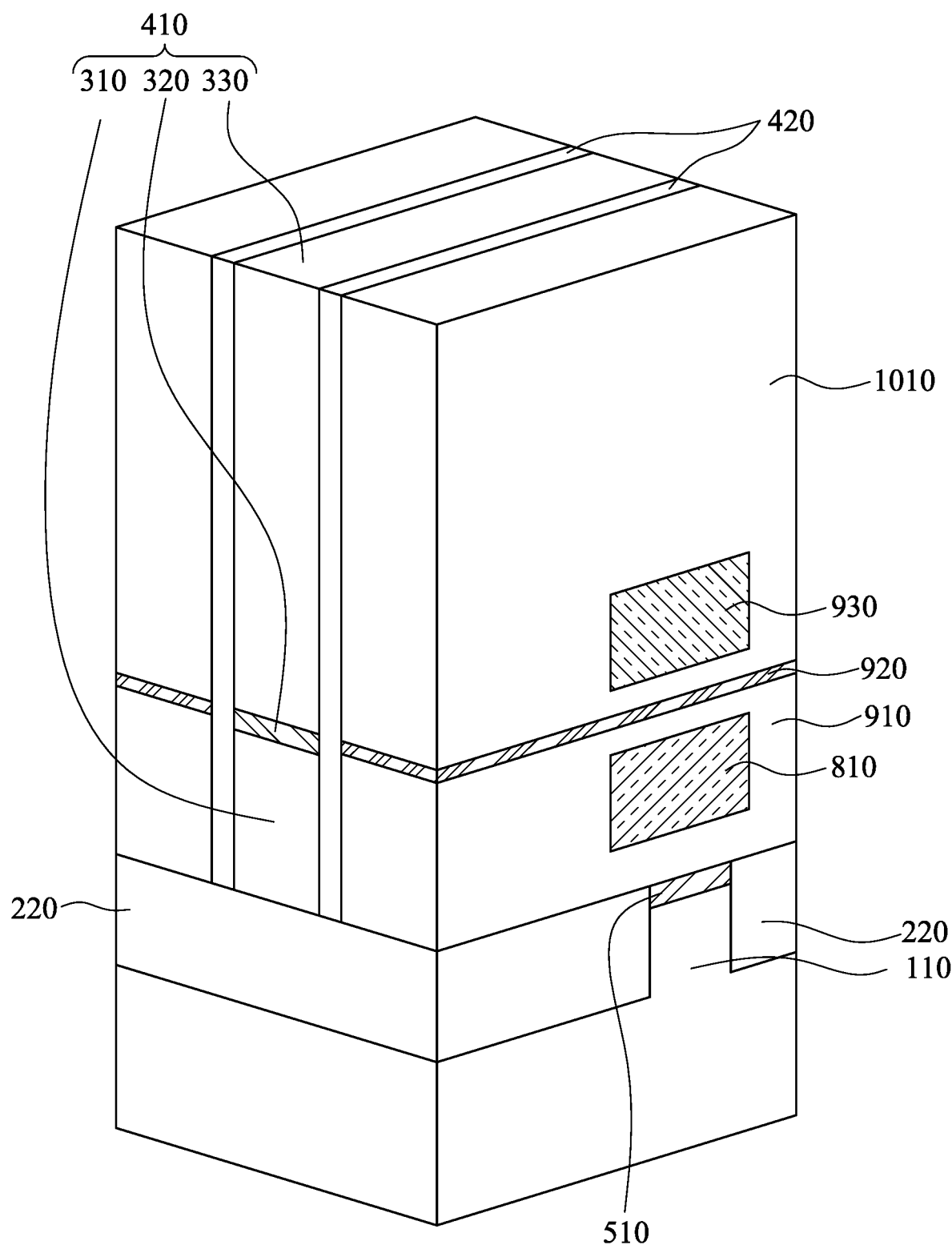

Reference is made to FIG. 10. A top ILD 1010 is formed on the etch stop layer 920 and at least on opposite sides of the dummy gate stack 410. In some embodiments, the top ILD 1010 may include materials different from the bottom ILD 910 and may be dielectric materials, such as an oxide layer. In some embodiments, the top ILD 1010 may be formed by various process operations such as layer deposition, planarization, as well as other suitable processing operations. Exemplary layer deposition processes includes Flowable Chemical Vapor Deposition (FCVD), low-pressure CVD, plasma-enhanced CVD, PVD, ALD, thermal oxidation, e-beam evaporation, or other suitable deposition techniques, or combinations thereof. A planarization process, such as a CMP process, may be then performed to expose the top surface of the second dummy gate layer 330. The CMP process may remove portions of the top ILD 1010 and the patterned hard mask 340 overlying the second dummy gate layer 330 and may planarize a top surface of the structure.

Figure 11A:
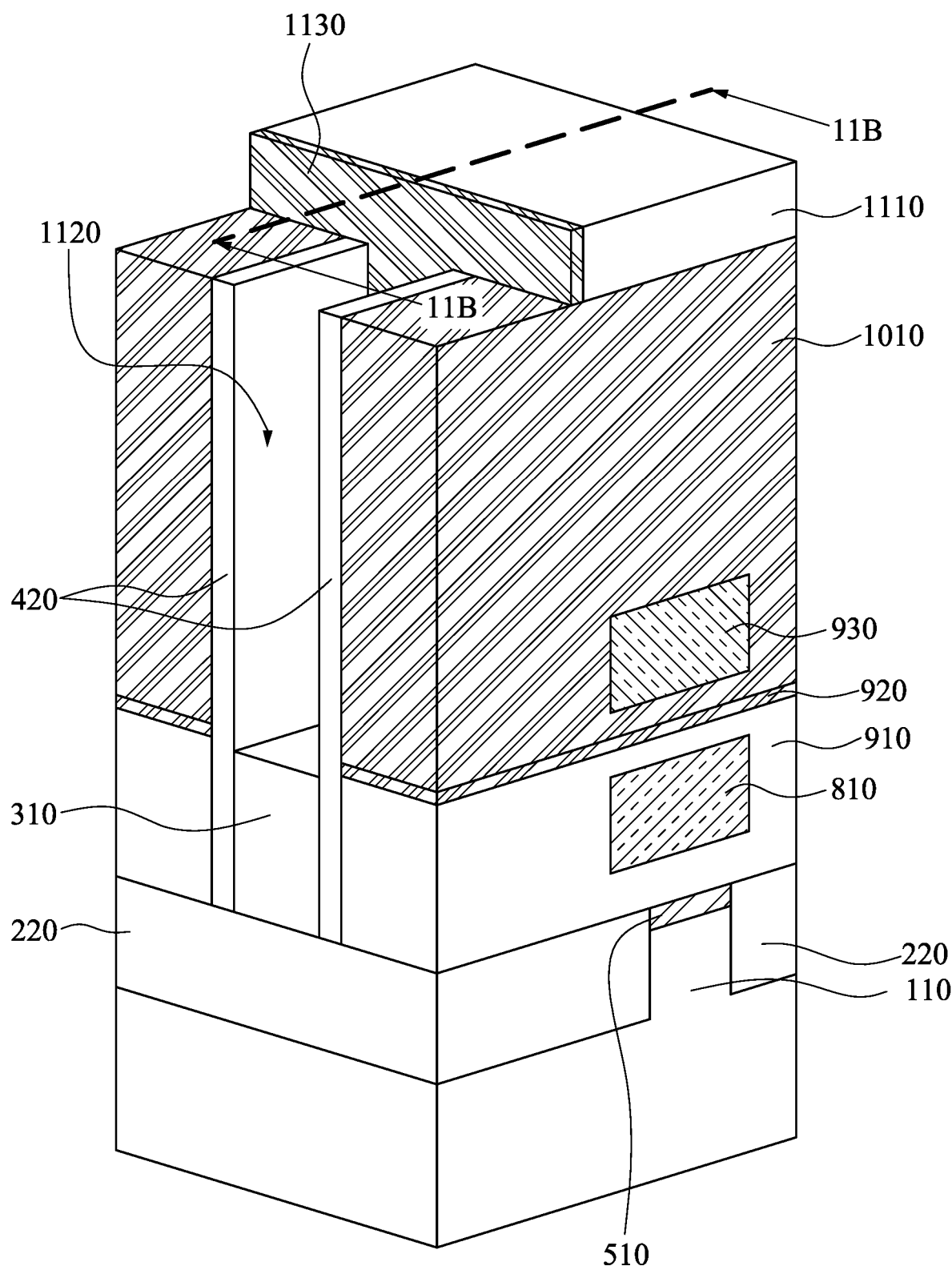
Figure 11B:
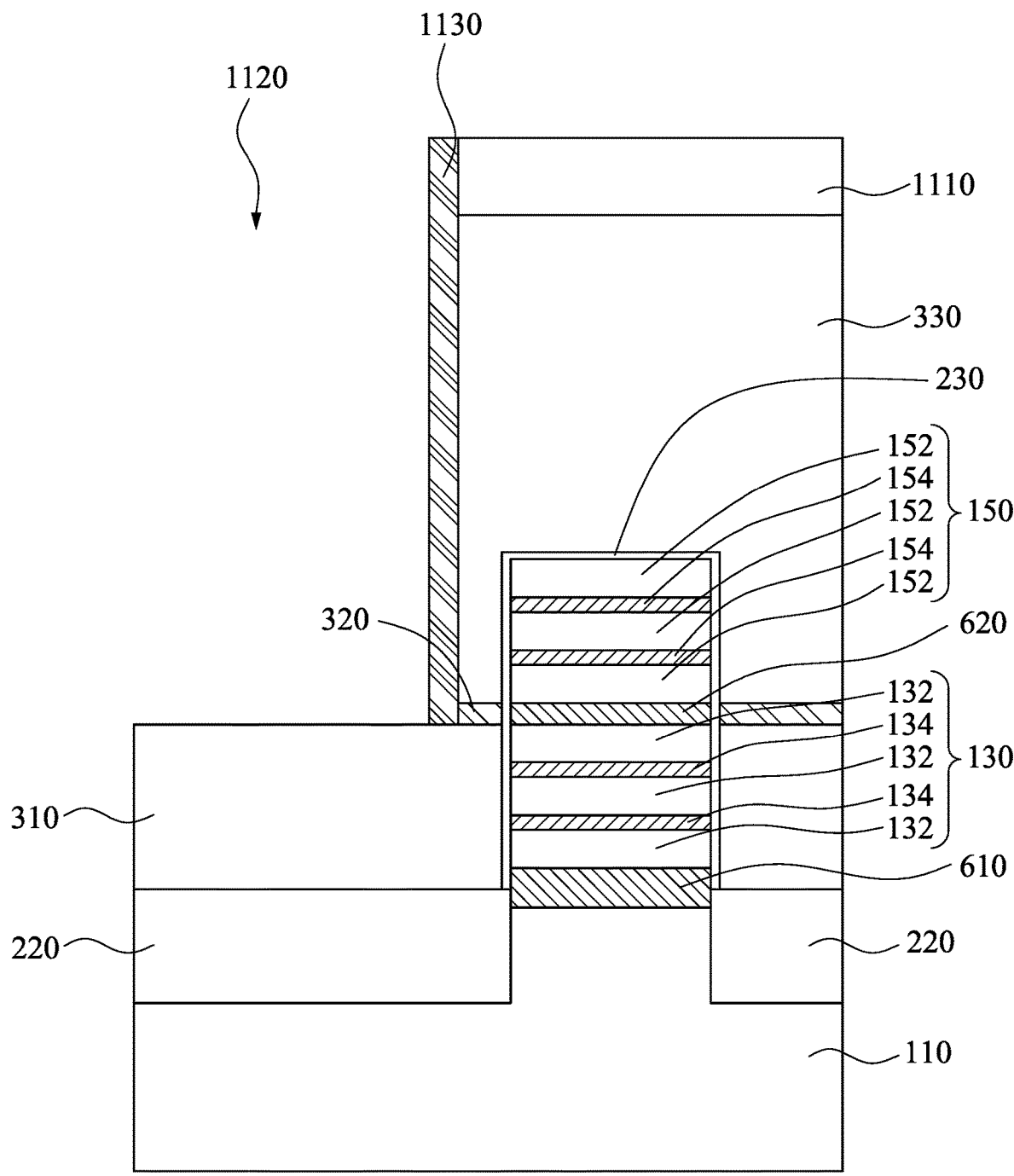
FIG. 11B is a cross-sectional view taking along line 11B-11B of FIG. 11A.

Reference is made to FIGS. 11A and 11B, where FIG. 11B is a cross-sectional view taking along line 11B-11B of FIG. 11A. A patterned hard mask 1110 is formed over the second dummy gate layer 330, the gate spacers 420, and the top ILD 1010. In some embodiments, the patterned hard mask 1110 is formed of silicon nitride, silicon oxynitride, silicon carbide, silicon carbo-nitride, or the like. The patterned hard mask 1110 covers portions of the second dummy gate layer 330, the gate spacers 420, and the top ILD 1010 while leaves other portions of the second dummy gate layer 330, the gate spacers 420, and the top ILD 1010 uncovered. Specifically, the patterned hard mask 1110 covers the first epitaxy structures 810, the second epitaxy structures 930, and the semiconductor stacks 130 and 150.

The second dummy gate layer 330 and the etch stop layer 320 are patterned using the patterned hard mask 1110 as a mask to form at least one trench 1120 between the gate spacers 420. That is, the trench 1120 exposes the first dummy gate layer 310. However, the trench 1120 does not expose the dummy dielectric layer 230.

A third inner gate spacer 1130 is formed at least on sidewalls of the second dummy gate layer 330 and the etch stop layer 320 exposed by the trench 1120. For example, a dielectric layer is conformally formed on the exposed surfaces of the trench 1120, and then an etching process, such as a dry etching process, is performed to remove portions of the dielectric layer to form the third inner gate spacer 1130 on the sidewalls of the second dummy gate layer 330 and the etch stop layer 320. Furthermore, the third inner gate spacer 1130 may be formed on the sidewall of the patterned mask layer 1110. In some embodiments, the third inner gate spacer 1130 may be formed by SiN, oxide, metal oxide, or other dielectric such as SiCxOyNz. In some embodiments, the third inner gate spacer 1130 may be formed by performing an ALD process or other suitable process.

Figure 12A:
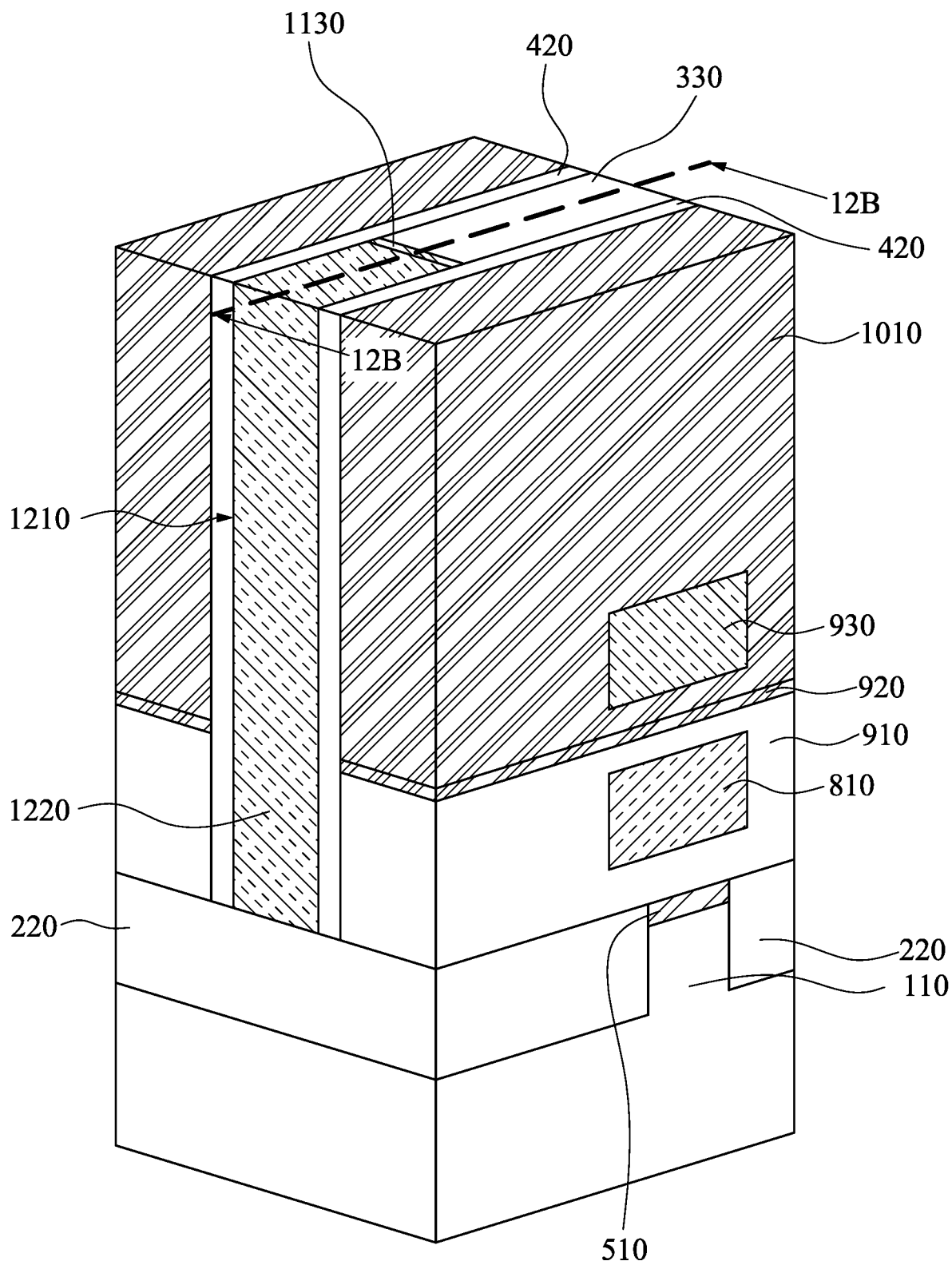
Figure 12B:
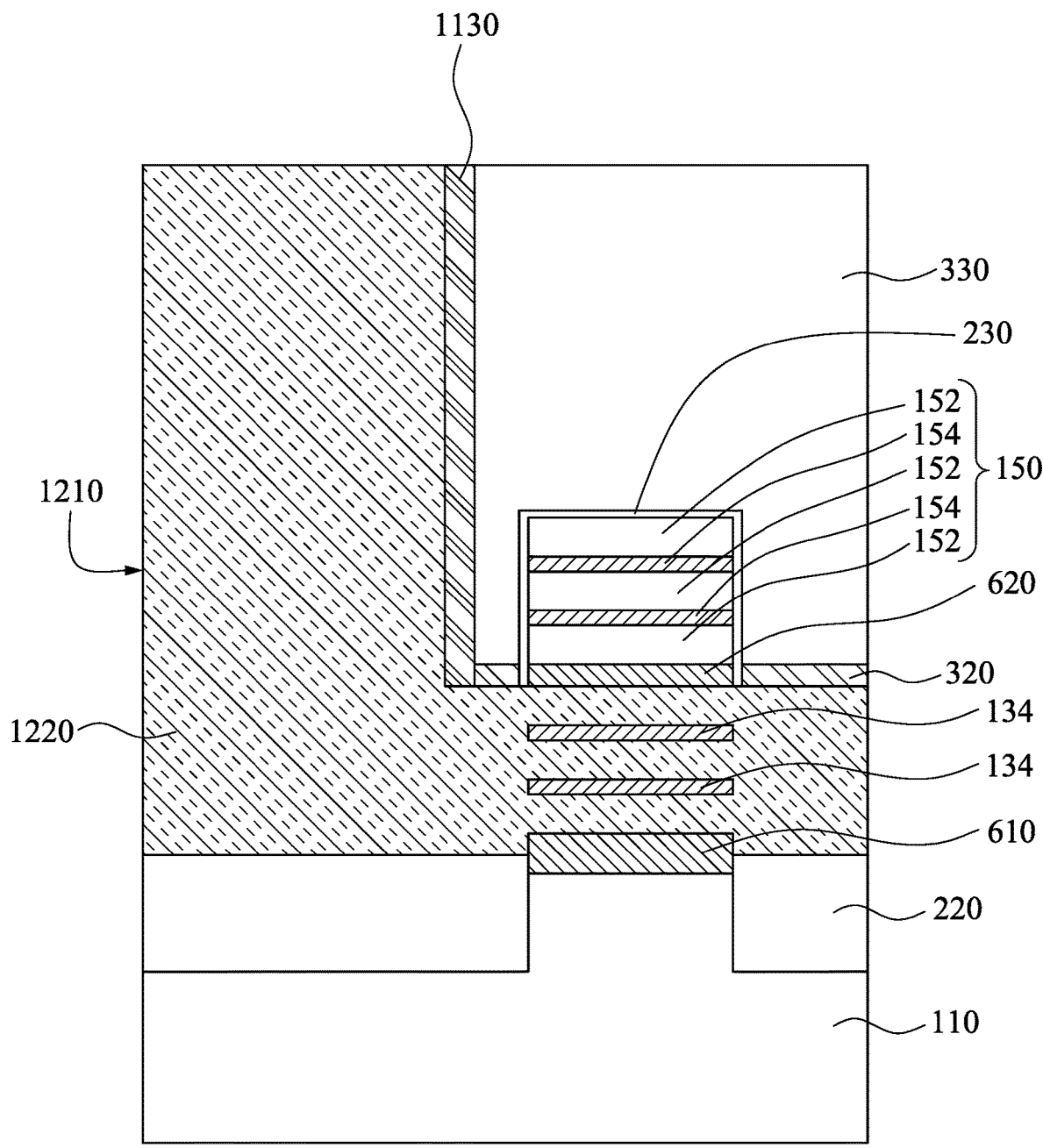
FIG. 12B is a cross-sectional view taking along line 12B-12B of FIG. 12A.

Reference is made to FIGS. 12A and 12B, where FIG. 12B is a cross-sectional view taking along line 12B-12B of FIG. 12A. The remained first dummy gate layer 310, a portion of the dummy dielectric layer 230, and the semiconductor layers 132 (see FIGS. 11A and 11B) are removed to form a recess 1210, such that the semiconductor layers 134 are exposed. In some embodiments, the remained first dummy gate layer 310, the portion of the dummy dielectric layer 230, and the semiconductor layers 132 are removed by performing multiple etching processes. That is, a first etching process is performed to remove the remained first dummy gate layer 310, and the portion of the dummy dielectric layer 230 is exposed; a second etching process is then performed to remove the exposed dummy dielectric layer 230, and the semiconductor layers 132 and 134 are exposed; a third etching process is performed to selectively remove the semiconductor layers 132 but not the semiconductor layers 134. As such, the semiconductor layers 134 remain, are spaced apart from each other, and are suspended over the substrate 110. After the removal of the semiconductor layers 134, the recess 1210 is defined by the isolation structures 220, the first inner gate spacer 610, the etch stop layer 320, the second inner gate spacer 620, the third inner gate spacer 1130, and the gate spacers 420.

A first metal gate stack 1220 is formed and/or filled in the recess 1210. That is, the first metal gate stack 1220 encircles (wraps) the semiconductor layers 134. The gate spacers 420 are disposed on opposite sides of the first metal gate stack 1220. The first metal gate stack 1220 includes a high-k gate dielectric layer, a work function metal layer, and a gate electrode. The high-k gate dielectric layer is conformally formed in the recess 1210. That is, the high-k gate dielectric layer is in contact with the isolation structures 220, the first inner gate spacer 610, the etch stop layer 320, the second inner gate spacer 620, the third inner gate spacer 1130, the gate spacers 420, and the semiconductor layers 134, in which the semiconductor layers 134 are referred to as channels of the first device 10 (see FIGS. 13A and 13B). Furthermore, the high-k gate dielectric layer surrounds the semiconductor layers 134, and spaces between the semiconductor layers 134 are still left after the deposition of the high-k gate dielectric layer. In some embodiments, the high-k gate dielectric layer includes a material such as hafnium oxide ($HfO_2$), zirconium oxide ($ZrO_2$) or lanthanum oxide ($La_2O_3$). In some embodiments, the high-k gate dielectric layer may be formed by performing an ALD process or other suitable process.

The work function metal layer is conformally formed on the high-k gate dielectric layer, and the work function metal layer surrounds the semiconductor layers 134 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process.

The gate electrode fills the remained space in the recess 1210. That is, the work function metal layer is in contact with and between the high-k gate dielectric layer and the gate electrode. The gate electrode may include material such as tungsten or aluminum. After the deposition of the high-k gate dielectric layer, the work function metal layer, and the gate electrode, a planarization process, such as a CMP process, may be then performed to remove portions of the high-k gate dielectric layer, the work function metal layer, and the gate electrode outside the recess 1210 to form the first metal gate stack 1220. In FIGS. 12A and 12B, the first metal gate stack 1220 is a p-type metal gate stack.

Figure 13A:
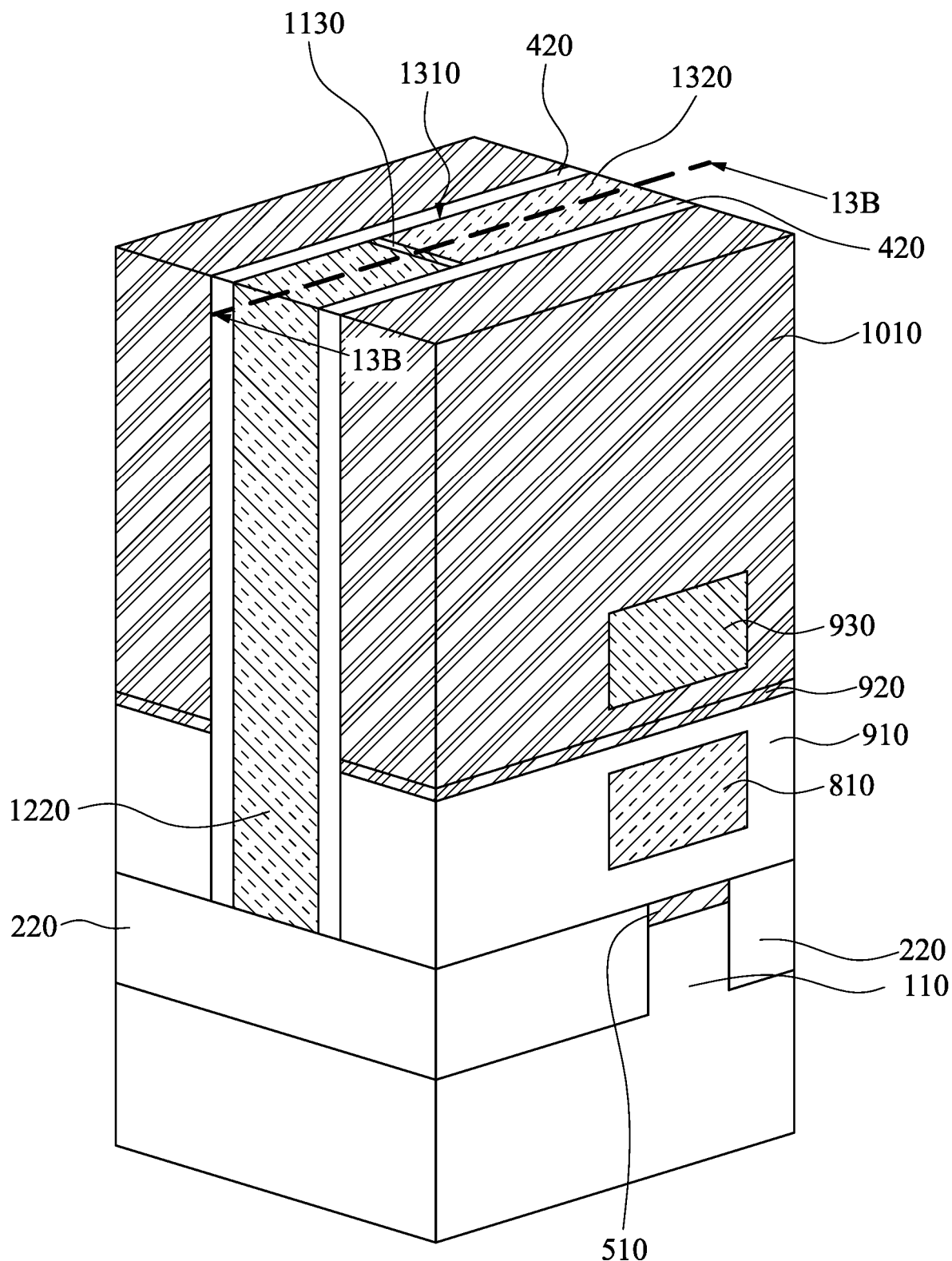
Figure 13B:
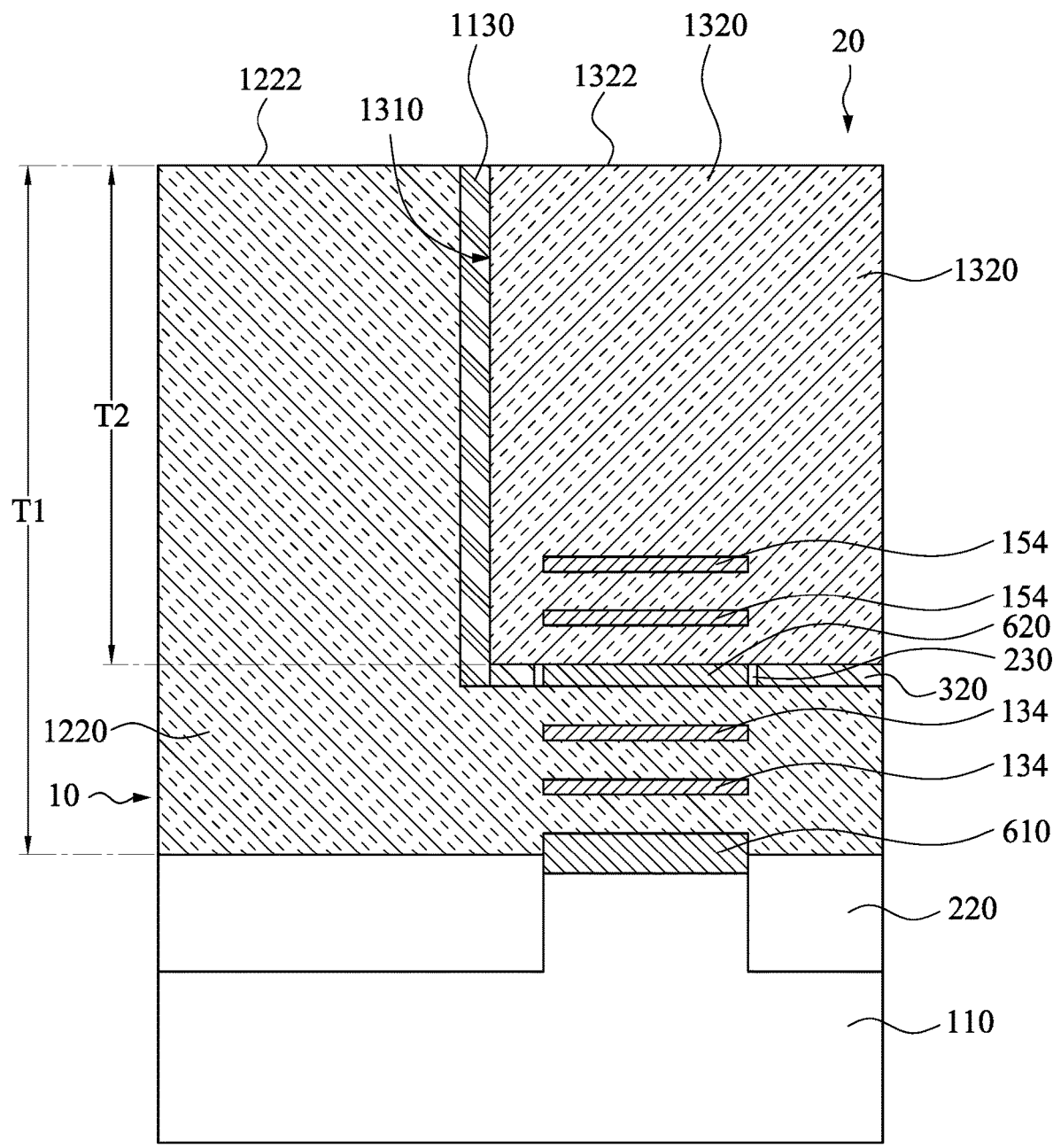
FIG. 13B is a cross-sectional view taking along line 13B-13B of FIG. 13A.

Reference is made to FIGS. 13A and 13B, where FIG. 13B is a cross-sectional view taking along line 13B-13B of FIG. 13A. The remained second dummy gate layer 330, the remained dummy dielectric layer 230, and the semiconductor layers 152 (see FIGS. 12A and 12B) are removed to form a recess 1310, such that the semiconductor layers 154 are exposed. In some embodiments, the remained second dummy gate layer 330, the remained dummy dielectric layer 230, and the semiconductor layers 152 are removed by performing multiple etching processes. That is, a first etching process is performed to remove the remained second dummy gate layer 330, and the remained dummy dielectric layer 230 is exposed; a second etching process is then performed to remove the exposed dummy dielectric layer 230, and the semiconductor layers 152 and 154 are exposed; a third etching process is performed to selectively remove the semiconductor layers 152 but not the semiconductor layers 154. As such, the semiconductor layers 154 remain, are spaced apart from each other, and are suspended over the second inner gate spacer 620. In some embodiments, the thickness of the etch stop layer 320 can be thick enough to prevent the etch stop layer 320 from removing during the second etching process. After the removal of the semiconductor layers 154, the recess 1310 is defined by the etch stop layer 320, the second inner gate spacer 620, the third inner gate spacer 1130, and the gate spacers 420.

A second metal gate stack 1320 is formed and/or filled in the recess 1310. That is, the second metal gate stack 1320 encircles (wraps) the semiconductor layers 154 and is formed over the first metal gate stack 1220. The gate spacers 420 are disposed on opposite sides of the second metal gate stack 1320. The second metal gate stack 1320 includes a high-k gate dielectric layer, a work function metal layer, and a gate electrode. The high-k gate dielectric layer is conformally formed in the recess 1310. That is, the high-k gate dielectric layer is in contact with the etch stop layer 320, the second inner gate spacer 620, the third inner gate spacer 1130, the gate spacers 420, and the semiconductor layers 154, in which the semiconductor layers 154 are referred to as channels of a second device 20. Furthermore, the high-k gate dielectric layer surrounds the semiconductor layers 154, and spaces between the semiconductor layers 154 are still left after the deposition of the high-k gate dielectric layer. In some embodiments, the high-k gate dielectric layer includes a material such as hafnium oxide ($HfO_2$), zirconium oxide ($ZrO_2$) or lanthanum oxide ($La_2O_3$). In some embodiments, the high-k gate dielectric layer may be formed by performing an ALD process or other suitable process.

The work function metal layer is conformally formed on the high-k gate dielectric layer, and the work function metal layer surrounds the semiconductor layers 154 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process.

The gate electrode fills the remained space in the recess. That is, the work function metal layer is in contact with and between the high-k gate dielectric layer and the gate electrode. The gate electrode may include material such as tungsten or aluminum. After the deposition of the high-k gate dielectric layer, the work function metal layer, and the gate electrode, a planarization process, such as a chemical mechanical planarization (CMP) process, may be then performed to remove portions of the high-k gate dielectric layer, the work function metal layer, and the gate electrode outside the recess 1310 to form the second metal gate stack 1320. In FIGS. 13A and 13B, the second metal gate stack 1320 is an n-type metal gate stack.

It is noted that in FIGS. 13A and 13B, the first metal gate stack 1220 is a p-type metal gate stack, and the second metal gate stack 1320 is an n-type metal gate stack. In some other embodiments, however, the first metal gate stack 1220 can be an n-type metal gate stack, and the second metal gate stack 1320 can be a p-type metal gate stack. Embodiments fall within the present disclosure if the first metal gate stack 1220 and the second metal gate stack 1320 are different types or same type of metal gate stacks.

In FIGS. 13A and 13B, the semiconductor layers 134, the first epitaxy structures 810, and the first metal gate stack 1220 form a first device 10, such as a p-type FET (PFET). The semiconductor layers 154, the second epitaxy structures 930, and the second metal gate stack 1320 form a second device 20, such as an n-type FET (NFET). The first device 10 and the second device 20 have horizontal-gate-all-around (HGAA) configurations. That is, the first device 10 and the second device 20 are stacked on the substrate 110, and the first device 10 is disposed between the second device 20 and the substrate 110. The channels of the first device 10 (i.e., the semiconductor layers 134) is disposed between the substrate 110 and the channels of the second device 20 (i.e., the semiconductor layers 154).

The first device 10 is separated from the second device 20 by the etch stop layer 320, the second inner gate spacer 620, and the third inner gate spacer 1130. In greater detail, the etch stop layer 320, the second inner gate spacer 620, and the third inner gate spacer 1130 are disposed between and in contact with the first metal gate stack 1220 and the second metal gate stack 1320. That is, the first metal gate stack 1220 is isolated from the second metal gate stack 1320. Furthermore, the second inner gate spacer 620 is disposed between the semiconductor layers 134 and the semiconductor layers 154.

The second metal gate stack 1320 is disposed over the first metal gate stack 1220. In greater detail, the thickness T1 of the first metal gate stack 1220 is greater than the thickness T2 of the second metal gate 1320. A bottom surface of the first metal gate stack 1220 is lower than a bottom surface of the second metal gate stack 1320. The first metal gate stack 1220 has a top surface 1222 flush with a top surface 1322 of the second metal gate stack 1320. The isolation structure 220 is disposed between the first metal gate stack 1220 and the substrate 110, and the second metal gate stack 1320 is disposed over the isolation structure 220 and is spaced from the isolation structure 220 by the first metal gate stack 1220.

Figure 14:
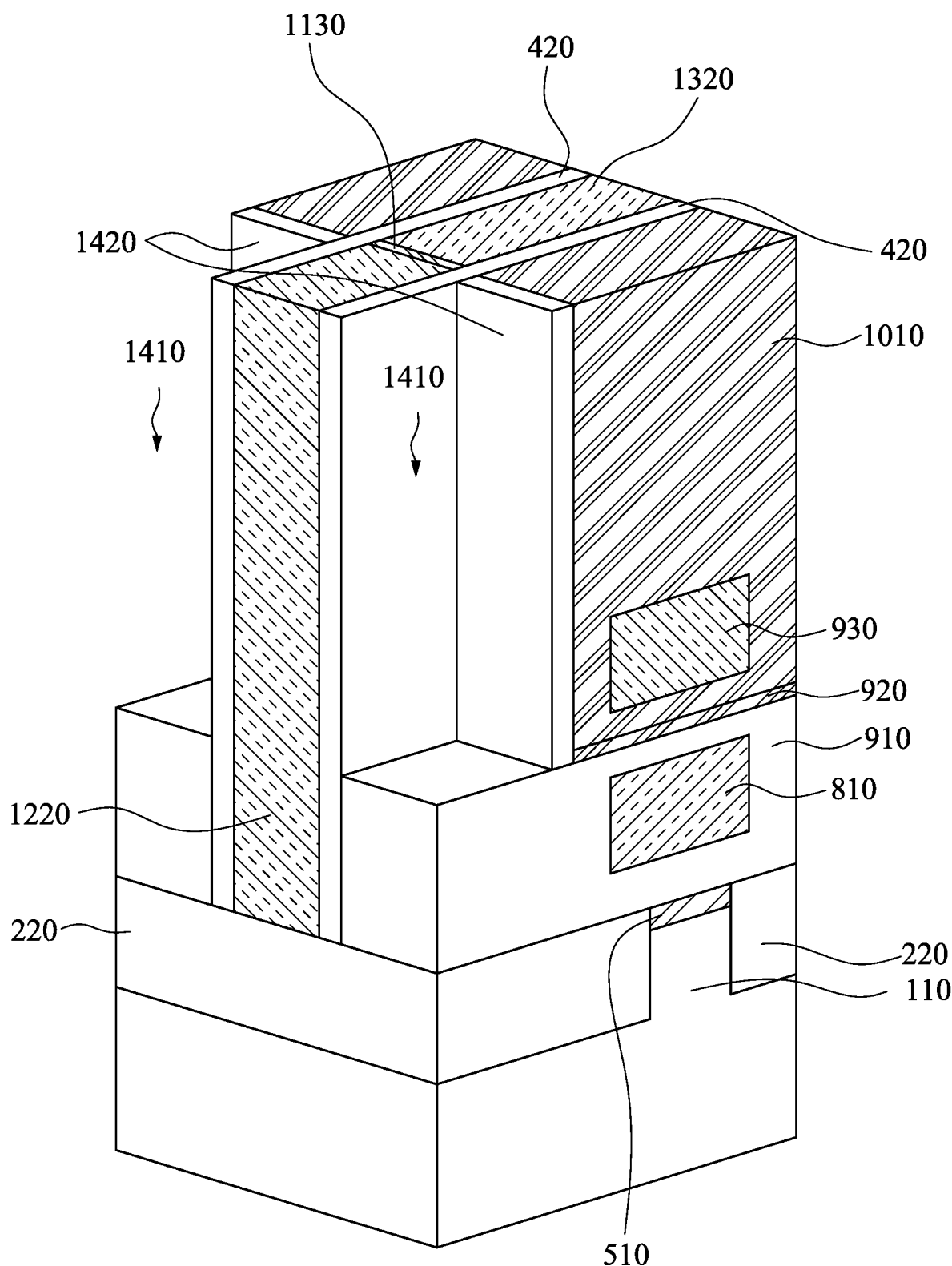

Reference is made to FIG. 14. The top ILD 1010 is patterned to form trenches 1410 on opposite sides of the first metal gate stack 1220. Contact spacers 1420 are formed at least on sidewalls of the remained top ILD 1010 and the etch stop layer 920 exposed by the trenches 1410. For example, a dielectric layer is conformally formed on the exposed surfaces of the trenches 1410, and then an etching process, such as a dry etching process, is performed to remove portions of the dielectric layer to form the contact spacers 1420 on the sidewalls of the remained top ILD 1010 and the etch stop layer 920. In some embodiments, the inner gate spacer 1130 may be formed by SiN, oxide, metal oxide, or other dielectric such as SiCxOyNz. In some embodiments, the contact spacers 1420 may be formed by performing an ALD process or other suitable process.

Figure 15:
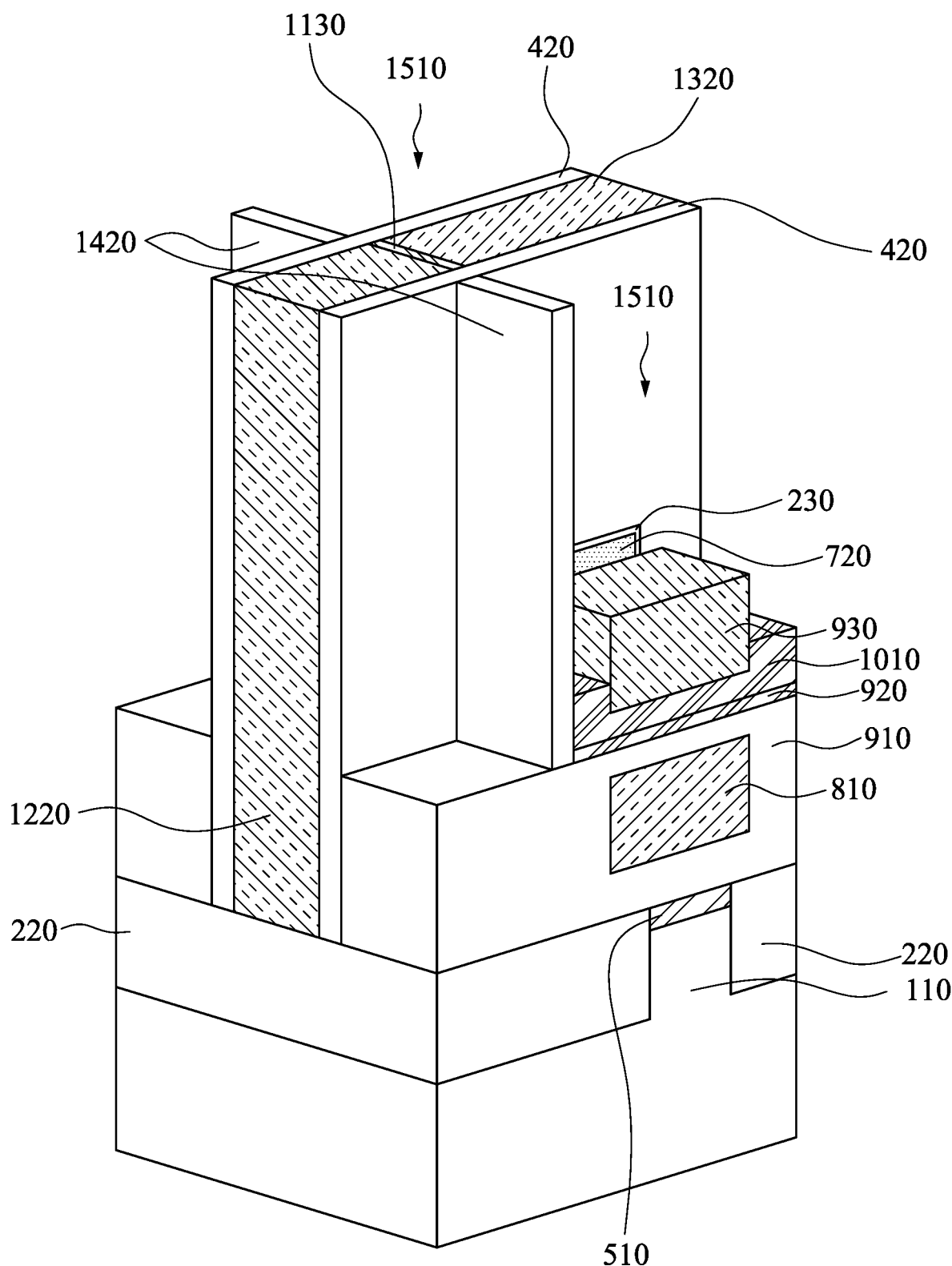

Reference is made to FIG. 15. The remained top ILD 1010 is recessed to from trenches 1510 on opposite sides of the second metal gate stack 1320. The trenches 1510 respectively expose at least portions of the second epitaxy structures 930. In some embodiments, the remained top ILD 1010 is partially removed, such that a portion of the top ILD 1010 remains on the etch stop layer 920 as shown in FIG. 15. In some other embodiments, the remained top ILD 1010 is removed, such that the etch stop layer 920 is exposed by the trenches 1510.

Figure 16:
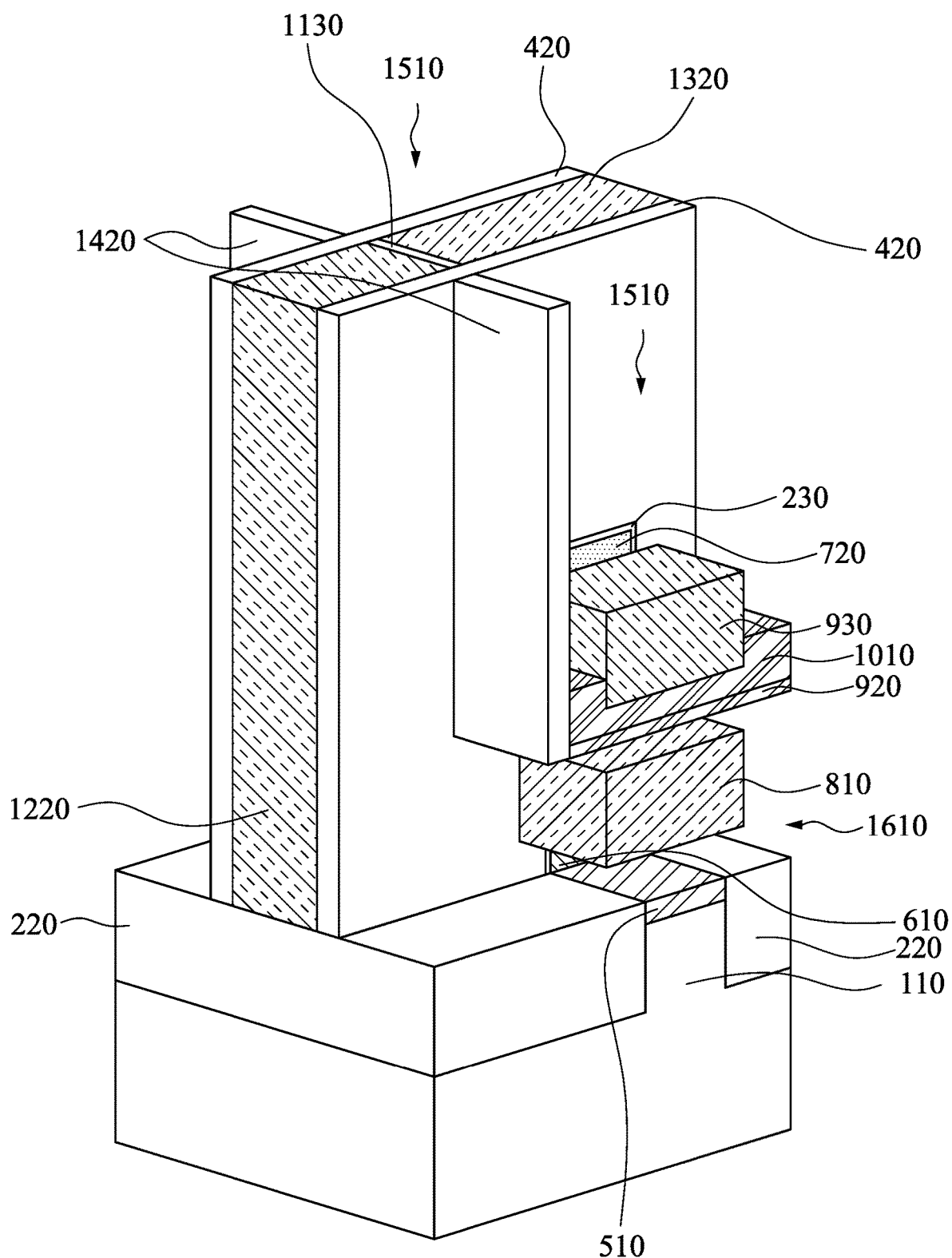

Reference is made to FIG. 16. The remained bottom ILD 910 is removed to from recesses 1610 on opposite sides of the first metal gate stack 1220. The recesses 1610 respectively expose the first epitaxy structures 810, the isolation structures 220, and the insulation layers 510.

Figure 17:
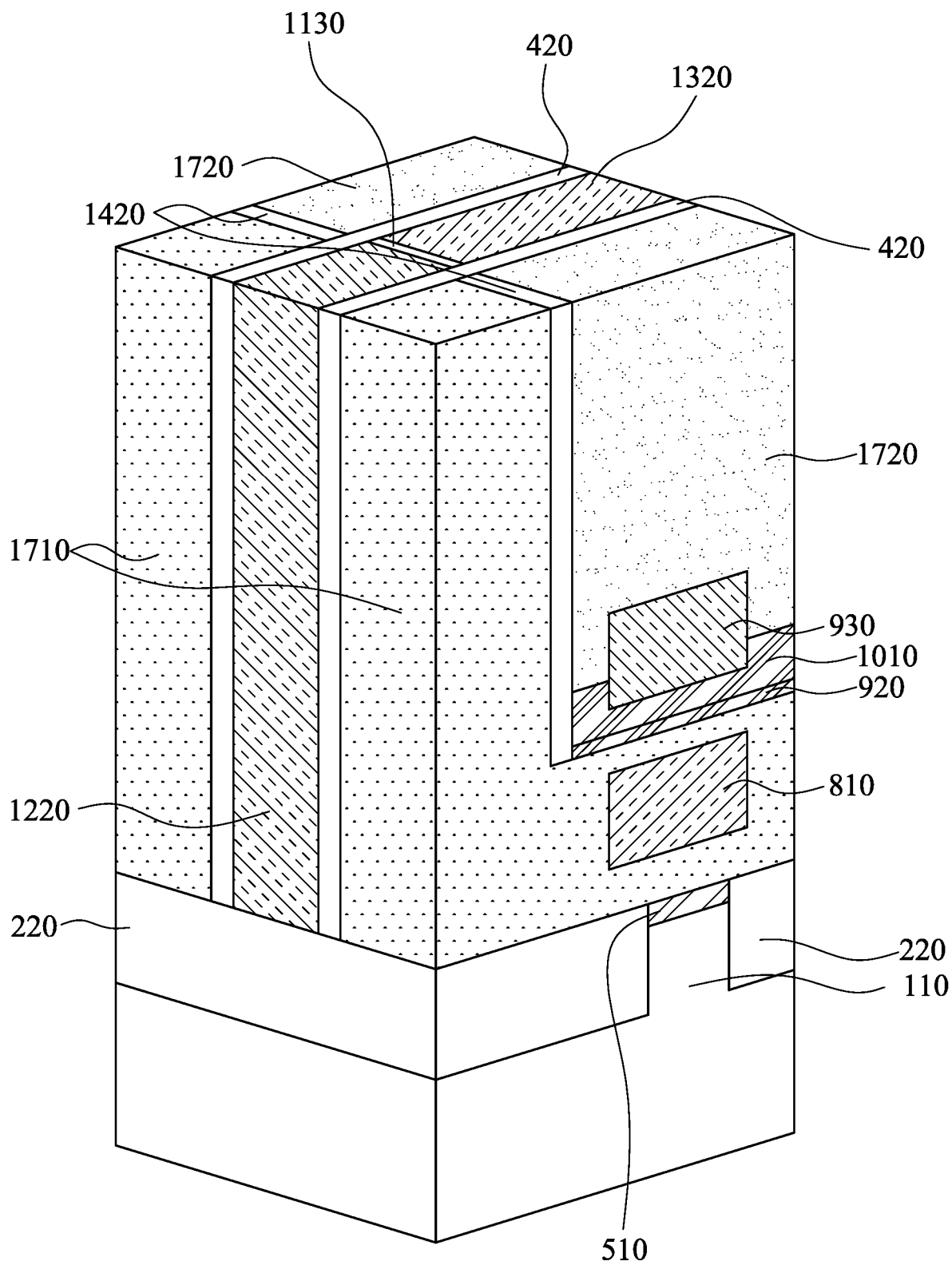

Reference is made to FIG. 17. The first epitaxy structures 810 and the second epitaxy structures 930 are performed a silicide process. A silicide region may be formed by blanket depositing a thin metal layer (not shown), such as nickel, platinum, palladium, vanadium, titanium, cobalt, tantalum, ytterbium, zirconium, and combinations thereof. The substrate 110 is then heated, which causes silicon and germanium to react with the metal where contacted. After the reaction, a layer of metal silicide is formed between the first epitaxy structure 810 (the second epitaxy structure 930) and the metal layer. The un-reacted metal layer is selectively removed through the use of an etchant that attacks metal but does not attack the germano-silicide.

After the silicide process, first contacts 1710 are respectively formed in the recesses 1610, and second contacts 1720 are respectively formed in the trenches 1510 and over the first contacts 1710. As such, the first contacts 1710 are in contact with and wrap the first epitaxy structures 810 while the second contacts 1720 are in contact with and wrap the second epitaxy structures 930. In some embodiments, the first contacts 1710 and the second contacts 1720 may be made of metal, such as W, Co, Ru, Al, Cu, or other suitable materials. After the deposition of the first contacts 1710 and the second contacts 1720, a planarization process, such as a chemical mechanical planarization (CMP) process, may be then performed. As such, a top surface of the first contact 1710 and a top surface of the second contact 1720 are coplanar.

The first contact 1710 is separated from the second contact 1720 by the etch stop layer 920, the top ILD 1010, and the contact spacer 1420. In greater detail, the etch stop layer 920, the top ILD 1010, and the contact spacer 1420 are disposed between and in contact with the first contact 1710 and the second contact 1720. That is, the first contact 1710 is isolated from the second contact 1720. Furthermore, the etch stop layer 920 is disposed between the first epitaxy structure 810 and the second epitaxy structure 930.

According to some embodiments, the semiconductor device includes a plurality of HGAA devices stacked together. By applying an inner gate spacer between channels of the first device and the second device, the channels can be stacked together while isolated from each other. In addition, the inner gate spacers further isolates the metal gate stacks of the first device and the second device. Moreover, the contacts of the first device and the second device are stacked together and isolated from each other. With this configuration, the layout area of the semiconductor device is reduced and the device density thereof is increased.

According to some embodiments, a semiconductor device includes a first device formed over a substrate. The first device includes a first gate stack encircling a first nanostructure, and the first device is a logic circuit device. The semiconductor device includes a second device formed over the first device. The second device includes a second gate stack encircling a second nanostructure, and the second device is a static random access memory (SRAM).

According to some embodiments, a semiconductor device includes a first device formed over a substrate. The first device includes a plurality of first nanostructures stacked in a vertical direction. The semiconductor device includes a second device formed over the first device. The second device includes a plurality of second nanostructures stacked in the vertical direction. One of the first and the second device is a p-type device and the other of the first and the second device is an n-type device.

According to some embodiments, a semiconductor device includes a first device formed over a substrate, and the first device comprises a number of first nanostructures stacked and spaced from each other. The semiconductor device includes a second device formed over the first device, and the second device includes a number of second nanostructures stacked and spaced from each other. The semiconductor device includes an inner gate spacer between the first nanostructures and the second nanostructures.

According to some embodiments, a semiconductor device includes a first device formed over a substrate, and the first device includes a first gate stack structure encircling a plurality of first nanostructures. The semiconductor device includes a first epitaxy structure wrapping an end of one of the first nanostructures, and a second device formed over the first device, wherein the second device includes a second gate stack structure encircling a plurality of second nanostructures. The semiconductor device includes a second epitaxy structure wrapping an end of one of the second nanostructures, and the second epitaxy structure is directly above the first epitaxy structure.

According to some embodiments, a semiconductor device includes a first device formed over a substrate, and the first device includes a plurality of first nanostructures stacked in a vertical direction, and a second device formed over the first device, and the second device includes a plurality of second nanostructures stacked in the vertical direction. The semiconductor device includes a first inner gate spacer between the first device and the second device. The semiconductor device includes an etch stop layer between the first nanostructures and the second nanostructures, and the etch stop layer is perpendicular to the first inner gate spacer.

According to some embodiments, a semiconductor device includes a first device formed over a substrate, and the first device includes a plurality of first nanostructures stacked and spaced from each other. The semiconductor device includes a first epitaxy structure wrapping an end of one of the first nanostructures. The semiconductor device includes a second device formed over the first device, and the second device includes a plurality of second nanostructures stacked and spaced from each other. The semiconductor device includes a second epitaxy structure wrapping an end of one of the second nanostructures. The semiconductor device includes a first contact surrounding the first epitaxy structure, and the first contact has a L-shaped structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first device formed over a substrate, wherein the first device comprises a first gate stack structure encircling a plurality of first nanostructures;
    a first epitaxy structure wrapping an end of one of the first nanostructures; and
    a second device formed over the first device, wherein the second device comprises a second gate stack structure encircling a plurality of second nanostructures; and
    a second epitaxy structure wrapping an end of one of the second nanostructures, wherein the second epitaxy structure is directly above the first epitaxy structure.

2. The semiconductor device as claimed in claim 1, further comprising:
    an inner gate spacer directly below the first nanostructures, wherein a top surface of the first inner gate spacer is higher than a bottom surface of the first gate stack structure.

3. The semiconductor device as claimed in claim 1, wherein a topmost surface of the first gate stack structure is substantially coplanar with a topmost surface of the second gate stack structure.

4. The semiconductor device as claimed in claim 1, wherein one of the first epitaxy structure and the second epitaxy structure is a p-type device and the other of the first epitaxy structure and the second epitaxy structure is an n-type device.

5. The semiconductor device as claimed in claim 1, further comprising:
    an inner gate spacer layer between the first nanostructures and the second nanostructures, wherein the inner gate spacer layer is between the first epitaxy structure and the second epitaxy structure.

6. The semiconductor device as claimed in claim 5, wherein a sidewall of the inner gate spacer layer is aligned with a sidewall of one of the first nanostructures.

7. The semiconductor device as claimed in claim 1, further comprising:
    a first contact wrapping the first epitaxy structure;
    a second contact wrapping the second epitaxy structure; and
    a contact spacer between the first contact and the second contact.

8. The semiconductor device as claimed in claim 7, wherein a top surface of the contact spacer is substantially coplanar with a top surface of the second contact.

9. The semiconductor device as claimed in claim 7, further comprising:
    a gate spacer formed on a sidewall of the first gate stack structure, wherein the contact spacer is formed on a sidewall of the gate spacer.

10. A semiconductor device, comprising:
    a first device formed over a substrate, wherein the first device comprises a plurality of first nanostructures stacked in a vertical direction;
    a second device formed over the first device, wherein the second device comprises a plurality of second nanostructures stacked in the vertical direction;
    a first inner gate spacer between the first device and the second device; and
    an etch stop layer between the first nanostructures and the second nanostructures, wherein the etch stop layer is perpendicular to the first inner gate spacer.

11. The semiconductor device as claimed in claim 10, wherein a bottom surface of the first inner gate spacer is lower than a bottommost second nanostructure.

12. The semiconductor device as claimed in claim 10, further comprising:
    a first gate stack structure wrapping the first nanostructures, wherein the first gate stack structure has an L-shaped structure.

13. The semiconductor device as claimed in claim 10, further comprising:
    a second inner gate spacer between the first device and the second device, wherein the second inner gate spacer is directly below the second nanostructures.

14. The semiconductor device as claimed in claim 10, further comprising:
    a first contact wraps the first epitaxy structure; and
    an insulating layer below the first contact, wherein the first contact is between the first epitaxy structure and the insulating layer, and the first contact is in direct contact with the insulating layer.

15. The semiconductor device as claimed in claim 10, further comprising:
a second epitaxy structure wrapping an end of one of the second nanostructures;
a dielectric layer formed adjacent to a bottom portion of the second epitaxy structure; and
a second contact formed adjacent to a top portion of the second epitaxy structure.

16. The semiconductor device as claimed in claim 15, further comprising:
a first epitaxy structure wrapping an end of one of the first nanostructures, wherein one of the first epitaxy structure and the second epitaxy structure is a p-type device and the other of the first epitaxy structure and the second epitaxy structure is an n-type device.

17. A semiconductor device, comprising:
a first device formed over a substrate, wherein the first device comprises a plurality of first nanostructures stacked and spaced from each other;
a first epitaxy structure wrapping an end of one of the first nanostructures;
a second device formed over the first device, wherein the second device comprises a plurality of second nanostructures stacked and spaced from each other;
a second epitaxy structure wrapping an end of one of the second nanostructures; and
a first contact surrounding the first epitaxy structure, wherein the first contact has a L-shaped structure.

18. The semiconductor device as claimed in claim 17, wherein the first contact has an extending portion which is directly below the second device.

19. The semiconductor device as claimed in claim 17, further comprising:
a second contact surrounding the second epitaxy structure; and
a contact spacer between the first contact and the second contact, wherein the second contact is separated from the first contact by the contact spacer.

20. The semiconductor device as claimed in claim 19, further comprising:
an etch stop layer between the first contact and the second contact, wherein the etch stop layer is in direct contact with the contact spacer.

* * * * *